(12) United States Patent
Klein et al.

(10) Patent No.: US 6,821,912 B2
(45) Date of Patent: Nov. 23, 2004

(54) SUBSTRATE PROCESSING PALLET AND RELATED SUBSTRATE PROCESSING METHOD AND MACHINE

(75) Inventors: Martin P. Klein, Bedford, MA (US); David Felsenthal, Marblehead, MA (US); Piero Sferlazzo, Marblehead, MA (US)

(73) Assignee: NEXX Systems Packaging, LLC, Billerica, MA (US)

( * ) Notice: Subject to any disclaimer, the term of this patent is extended or adjusted under 35 U.S.C. 154(b) by 19 days.

(21) Appl. No.: 09/917,224

(22) Filed: Jul. 27, 2001

(65) Prior Publication Data

US 2002/0034883 A1 Mar. 21, 2002

Related U.S. Application Data

(60) Provisional application No. 60/221,030, filed on Jul. 27, 2000.

(51) Int. Cl.[7] .................. H01L 21/31; H01L 21/469
(52) U.S. Cl. .................. 438/782; 414/935; 414/936; 414/938; 414/940; 414/941
(58) Field of Search .................. 438/107, 782; 414/935, 936, 937, 938, 940, 941, 217, 939; 118/500

(56) References Cited

U.S. PATENT DOCUMENTS

| | | |
|---|---|---|
| 3,902,615 A | 9/1975 | Levy et al. |
| 3,972,424 A | 8/1976 | Levy et al. |
| 4,008,815 A | 2/1977 | Fisk |
| 4,405,435 A | 9/1983 | Tateishi et al. |
| 4,437,961 A | 3/1984 | Routh et al. |
| 4,586,743 A | 5/1986 | Edwards et al. |
| 4,588,343 A | 5/1986 | Garrett |
| 4,668,365 A | 5/1987 | Foster et al. |
| 4,715,921 A | 12/1987 | Maher et al. |

(List continued on next page.)

FOREIGN PATENT DOCUMENTS

| | | |
|---|---|---|
| EP | 0 492 114 A1 | 7/1992 |
| GB | 2 171 119 A | 8/1986 |
| JP | 63024632 | 2/1988 |
| JP | 01004472 | 1/1989 |
| JP | 1123068 | 5/1989 |
| JP | 01309961 | 12/1989 |
| JP | 03094070 | 4/1991 |
| JP | 3-227536 | 8/1991 |
| JP | 05171432 | 7/1993 |
| JP | 05339723 | 12/1993 |
| JP | 06184741 | 7/1994 |

OTHER PUBLICATIONS

"Automatic System for Single Wafer Reactive Ion Etching," *IBM Technical Disclosure Bulletin*, vol. 33, No. 2, Jul. 1990, pp. 239–242.

Haller et al., "High Frequency Performance of GE High Density Interconnect Modules," *IEEE Transactions on Components, Hybrids, and Manufacturing Technology*, vol. 16, No. 1, Feb. 15, 1993, pp. 1–5.

*Primary Examiner*—W. David Coleman
*Assistant Examiner*—Khiem Nguyen
(74) *Attorney, Agent, or Firm*—Proskauer Rose LLP

(57) ABSTRACT

A substrate processing pallet has a top surface and a plurality of side surfaces. The top surface has at least one recess adapted to receive a substrate. The recess includes a support structure adapted to contact a portion of a substrate seated in the recess and a plurality of apertures each adapted to accommodate a lift pin. Lift pins can extend through the apertures initially to support the substrate and retract to deposit the substrate onto the support structure. A side surface includes a process positioning feature adapted to engage with a feature located in a process chamber to position the pallet. A side surface includes a positioning feature adapted to engage with an end effector alignment feature to position the pallet with respect to the end effector during transport. A side surface includes support features adapted to engage with end effector support features to support the pallet during transport.

17 Claims, 12 Drawing Sheets

U.S. PATENT DOCUMENTS

| | | | |
|---|---|---|---|
| 4,747,928 A | 5/1988 | Takahashi et al. | |
| 4,749,465 A | 6/1988 | Flint et al. | |
| 4,785,962 A | 11/1988 | Toshima | |
| 4,819,167 A | 4/1989 | Cheng et al. | |
| 4,842,683 A | 6/1989 | Cheng et al. | |
| 4,872,947 A | 10/1989 | Wang et al. | |
| 4,892,753 A | 1/1990 | Wang et al. | |
| 4,911,597 A | 3/1990 | Maydan et al. | |
| 4,951,601 A | 8/1990 | Maydan et al. | |
| 4,962,441 A | 10/1990 | Collins | |
| 5,000,113 A | 3/1991 | Wang et al. | |
| 5,013,385 A | 5/1991 | Maher et al. | |
| 5,046,909 A | 9/1991 | Murdoch | |
| 5,102,495 A | 4/1992 | Maher et al. | |
| 5,110,249 A | 5/1992 | Norman | |
| 5,199,483 A | 4/1993 | Bahng | |
| 5,200,049 A | 4/1993 | Stevenson et al. | |
| 5,215,619 A | 6/1993 | Cheng et al. | |
| 5,224,809 A | 7/1993 | Maydan et al. | |
| 5,227,708 A | 7/1993 | Lowrance | |
| 5,242,043 A | 9/1993 | Sturm | |
| 5,269,643 A * | 12/1993 | Kodama et al. | 414/416.02 |
| 5,280,983 A | 1/1994 | Maydan et al. | |
| 5,292,393 A | 3/1994 | Maydan et al. | |
| 5,308,431 A | 5/1994 | Maher et al. | |
| 5,315,473 A | 5/1994 | Collins et al. | |
| 5,330,301 A | 7/1994 | Brancher | |
| 5,344,542 A | 9/1994 | Maher et al. | |
| 5,345,999 A | 9/1994 | Hosokawa | |
| 5,354,715 A | 10/1994 | Wang et al. | |
| 5,355,066 A | 10/1994 | Lowrance | |
| 5,360,996 A | 11/1994 | Nulman et al. | |
| 5,362,526 A | 11/1994 | Wang et al. | |
| 5,363,872 A | 11/1994 | Lorimer | |
| 5,371,042 A | 12/1994 | Ong | |
| 5,377,816 A | 1/1995 | Deligi et al. | |
| 5,387,067 A | 2/1995 | Grunes | |
| 5,391,035 A | 2/1995 | Krueger | |
| 5,399,387 A | 3/1995 | Law et al. | |
| 5,425,611 A | 6/1995 | Hughes et al. | |
| 5,427,666 A | 6/1995 | Mueller et al. | |
| 5,443,995 A | 8/1995 | Nulman | |
| 5,447,409 A | 9/1995 | Grunes et al. | |
| 5,460,689 A | 10/1995 | Raaijmakers et al. | |
| 5,469,035 A | 11/1995 | Lowrance | |
| 5,512,320 A | 4/1996 | Turner et al. | |
| 5,521,120 A | 5/1996 | Nulman et al. | |
| 5,527,605 A | 6/1996 | Doessel et al. | |
| 5,534,231 A | 7/1996 | Savas | |
| 5,538,390 A | 7/1996 | Salzman | |
| 5,556,147 A | 9/1996 | Somekh et al. | |
| 5,556,248 A | 9/1996 | Grunes | |
| 5,563,798 A | 10/1996 | Berken et al. | |
| 5,566,744 A | 10/1996 | Tepman | |
| 5,570,994 A | 11/1996 | Somekh et al. | |
| 5,579,718 A | 12/1996 | Freerks | |
| 5,607,009 A | 3/1997 | Turner et al. | |
| 5,607,776 A | 3/1997 | Mueller et al. | |
| 5,618,338 A | 4/1997 | Kurabayashi et al. | |
| 5,618,388 A | 4/1997 | Seeser et al. | |
| 5,630,690 A | 5/1997 | Salzman | |
| 5,630,916 A | 5/1997 | Gerrish et al. | |
| 5,630,917 A | 5/1997 | Guo | |
| 5,636,964 A | 6/1997 | Somekh et al. | |
| 5,643,366 A | 7/1997 | Somekh et al. | |
| 5,643,427 A | 7/1997 | Kobayashi et al. | |
| 5,656,902 A | 8/1997 | Lowrance | |
| 5,658,442 A | 8/1997 | Van Gogh et al. | |
| 5,661,913 A | 9/1997 | Kato et al. | |
| 5,674,786 A | 10/1997 | Turner et al. | |
| 5,678,980 A | 10/1997 | Grunes et al. | |
| 5,697,427 A | 12/1997 | Ngan et al. | |
| 5,697,750 A | 12/1997 | Fishkin et al. | |
| 5,730,801 A | 3/1998 | Tepman et al. | |
| 5,740,062 A | 4/1998 | Berken et al. | |
| 5,746,460 A | 5/1998 | Marohl et al. | |
| 5,746,897 A | 5/1998 | Heimanson et al. | |
| 5,747,360 A | 5/1998 | Nulman | |
| 5,764,012 A | 6/1998 | Lowrance | |
| 5,780,357 A | 7/1998 | Xu et al. | |
| 5,784,238 A | 7/1998 | Nering et al. | |
| 5,788,453 A | 8/1998 | Donde et al. | |
| 5,788,799 A | 8/1998 | Steger et al. | |
| 5,789,878 A | 8/1998 | Kroeker et al. | |
| 5,795,355 A | 8/1998 | Moran | |
| 5,799,860 A | 9/1998 | Demaray et al. | |
| 5,803,977 A | 9/1998 | Tepman et al. | |
| 5,810,937 A | 9/1998 | Gupta et al. | |
| 5,822,171 A | 10/1998 | Shamouilian et al. | |
| 5,824,197 A | 10/1998 | Tanaka | |
| 5,833,426 A | 11/1998 | Marohl | |
| 5,838,121 A | 11/1998 | Fairbairn et al. | |
| 5,844,195 A | 12/1998 | Fairbairn et al. | |
| 5,846,883 A | 12/1998 | Moslehi | |
| 5,851,602 A | 12/1998 | Law et al. | |
| 5,855,681 A | 1/1999 | Maydan et al. | |
| 5,861,086 A | 1/1999 | Khurana et al. | |
| 5,861,197 A | 1/1999 | Law et al. | |
| 5,871,588 A | 2/1999 | Moslehi et al. | |
| 5,871,811 A | 2/1999 | Wang et al. | |
| 5,877,086 A | 3/1999 | Aruga | |
| 5,879,127 A | 3/1999 | Grunes et al. | |
| 5,882,165 A | 3/1999 | Maydan et al. | |
| 6,139,695 A | 10/2000 | Washburn et al. | |
| 6,217,272 B1 * | 4/2001 | Felsenthal et al. | 414/217 |
| 6,430,468 B1 | 8/2002 | Tepman et al. | |

* cited by examiner

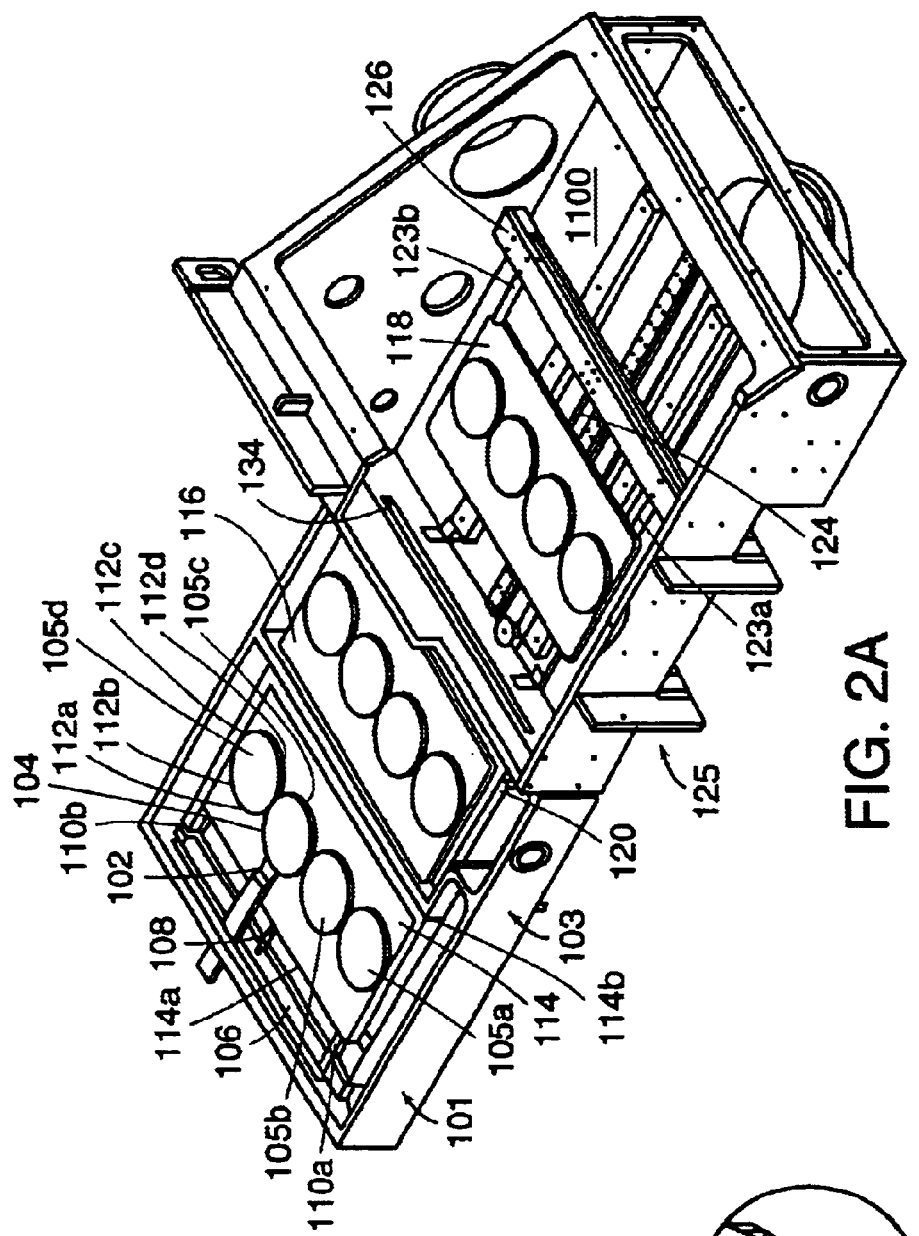
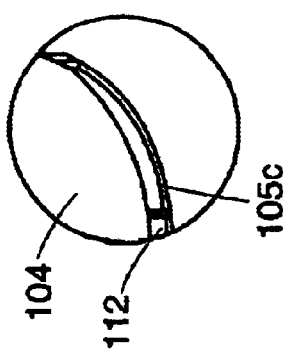
FIG. 2A
FIG. 2B

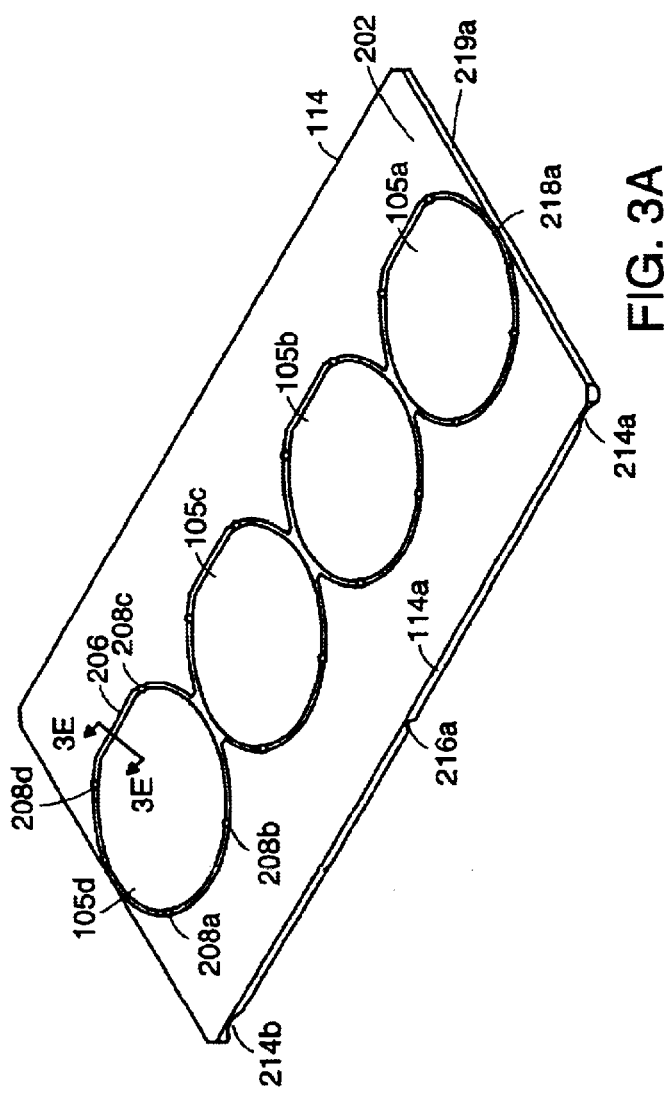
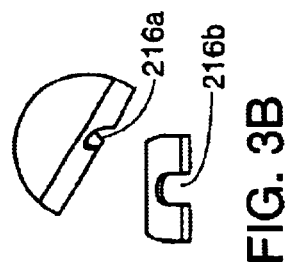
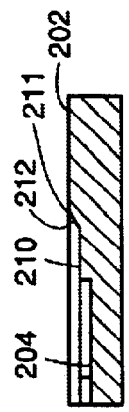
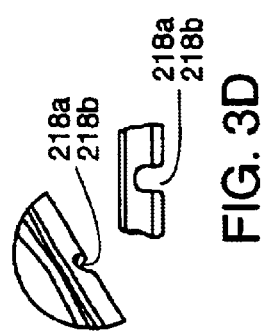
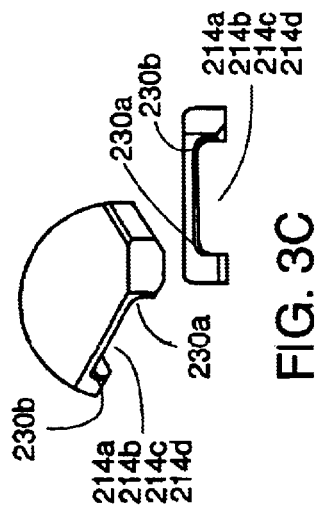

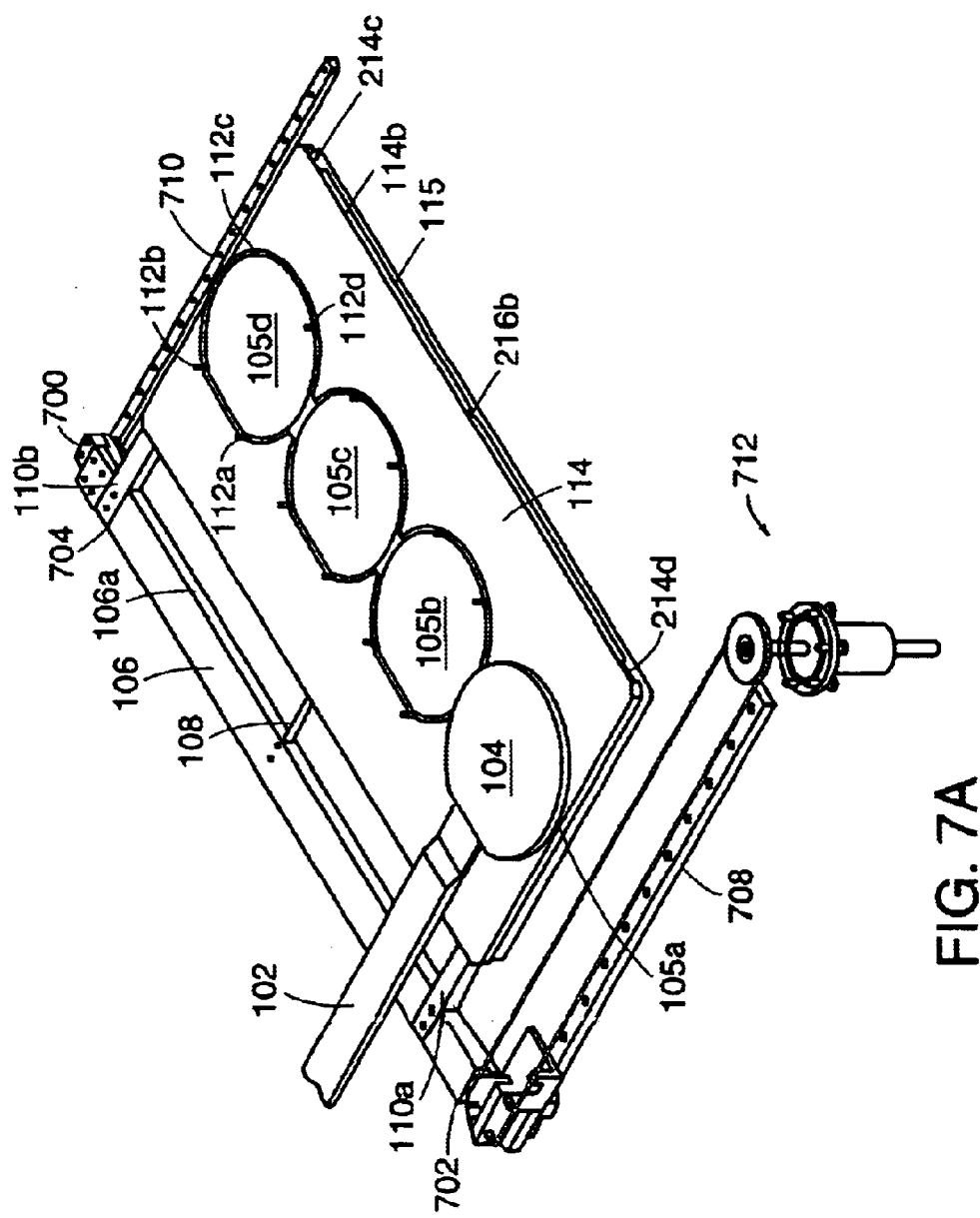
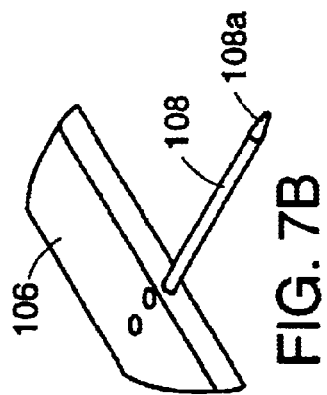
FIG. 7A
FIG. 7B

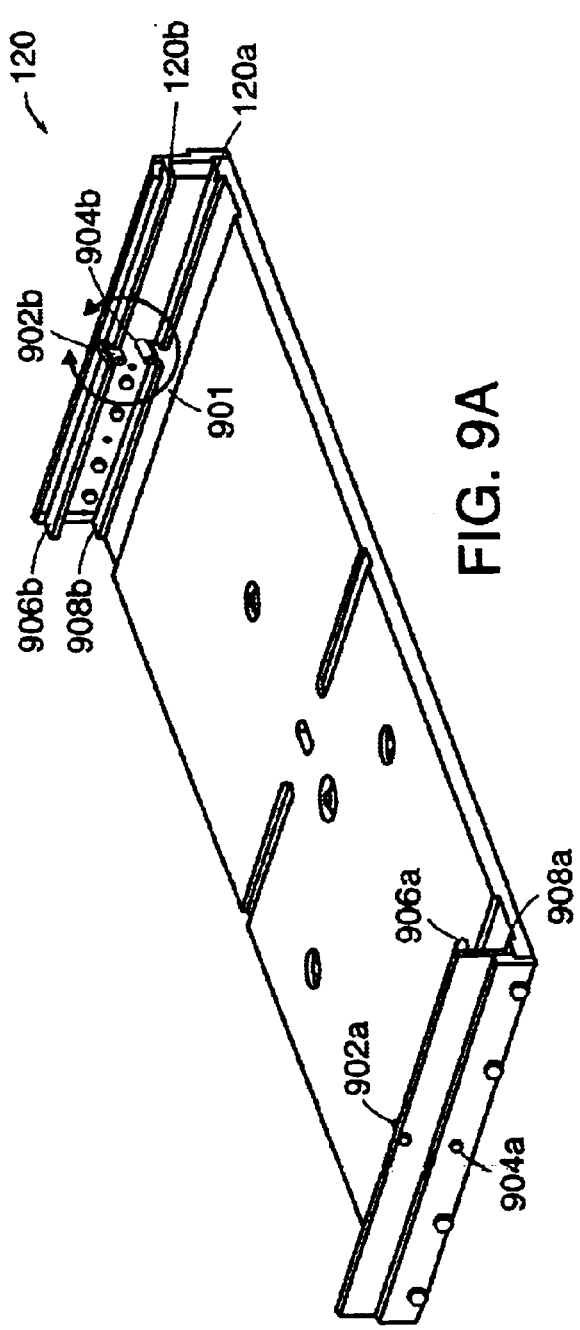
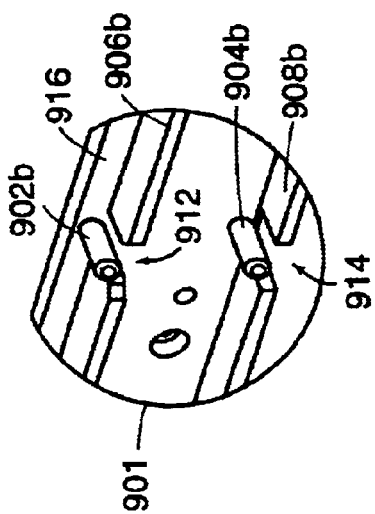
FIG. 9A
FIG. 9B

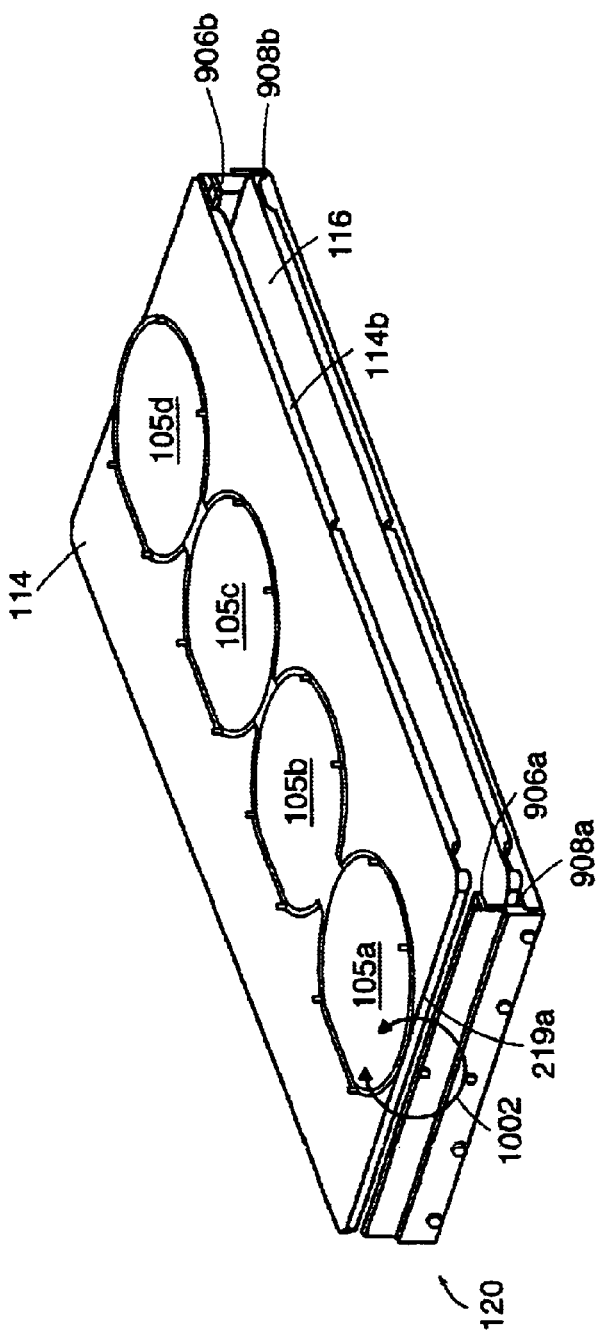
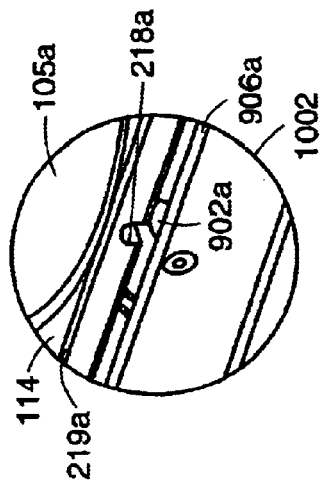
FIG. 10A
FIG. 10B

SUBSTRATE PROCESSING PALLET AND RELATED SUBSTRATE PROCESSING METHOD AND MACHINE

REFERENCE TO RELATED APPLICATIONS

This application claims the benefit of U.S. Provisional patent application Ser. No. 60/221,030, entitled "Wafer Tray For Semiconductor Processing" filed Jul. 27, 2000, the entire contents of which are hereby incorporated by reference. This application is also related to U.S. Pat. No. 6,217,272, entitled "In-Line Sputter Deposition System" and assigned to the assignee of the present patent application, the entire contents of which are hereby incorporated by reference. This application is also related to Attorney Docket Nos. ASX-054B and ASX-054C both entitled "Substrate Processing Pallet and Related Substrate Processing Method and Machine," and filed on evendate herewith, the entire contents of which are hereby incorporated by reference herein.

FIELD OF THE INVENTION

The invention generally relates to pallets adapted for holding one or more substrates during processing. More particularly, in one embodiment, the invention is directed to substrate processing pallets adapted to maintain an aligned position during substrate processing and methods and machines employing such substrate processing pallets.

BACKGROUND OF THE INVENTION

Conventional microelectronic and electro-optic device fabrication machines employ numerous processing steps including, for example, repetitive steps of depositing metal or dielectric films such as, silicon, gallium arsenide, and glass onto substrates. Such deposition typically takes place in an evacuated process chamber by way of any of a number of well know techniques, such as sputtering, evaporation and chemical vapor deposition (CVD).

Conventional substrate processing machines typically employ multiple chambers. By way of example, some conventional processing machines employ separate substrate storage, cleaning and deposition chambers. Typically, substrate processing machines employ complex mechanical mechanisms for transporting the substrates between the chambers. Conventional transport mechanisms can introduce substrate positioning errors. Additionally, during processing, the substrates and the various transport mechanisms and any substrate carrying pallets or pallets may be subjected to wide variations in temperature. Since the substrates, pallets/trays and transport mechanisms are typically formed from varying materials having varying thermal coefficients of expansion, exposure to temperature variations can introduce additional substrate positioning errors. Further, as a result of repetitive processing steps, these type of positioning errors can accumulate, causing even larger positioning errors. Some conventional processing machines employ such mechanisms as chain drives and tracking to reduce positioning error accumulation. However, such solutions tend to be expensive and complex.

One example of a conventional substrate processing machine employs cluster processing. Cluster processing machines provide a plurality of process chambers that are clustered around a central platform. A transport mechanism or robot moves the substrates between the various process chambers. Typically, each process chamber performs a single task and can be operated independently from the other process chambers. By way of example, individual process chambers may clean a substrate before processing, etch the substrate, etch a film deposited onto the substrate, and deposit metal or dielectric films onto the substrate. Because multiple chambers can process substrates concurrently, the throughput of cluster machines can be high.

However, typically, the deposition chambers within cluster machines are configured to deposit only one metal or dielectric film. Consequently, in a process requiring multiple layers of metals or dielectric films to be deposited on a substrate, the cluster machine deposits multiple layers sequentially in different process chambers. Thus, conventional cluster tools have a limited capability to deposit multiple layer film coatings, without having to reconfigure the process chambers. Due to the transport of the substrates between the multiple chambers, cluster machines can suffer from positional errors of the type discussed above.

Another conventional processing machine employs batch processing. Batch processing machines process a plurality of substrates (i.e., a batch) concurrently. Typically, such machines load substrates into a process chamber either one-by-one or by first loading the substrates onto a pallet or a tray and then loading the pallet into the process chamber. Batch processing machines can provide a high output, but are typically difficult to automate, difficult to scale to large wafer sizes and/or suffer from substrate alignment errors of the type discussed above.

Another conventional processing machine employs inline processing. Inline processing machines process substrates one by one, though a series of process steps. While, inline processing machines are versatile and have relatively high throughput, one disadvantage is that that the throughput is limited by the process time of the longest process step. Another disadvantage of the inline machines is that due to the use of separate stations for loading and unloading the substrates, they are structurally relatively long as compared to other processing machines. Thus, inline machines may be difficult to locate in space constrained processing facilities.

Thus, there exists a need for a relatively inexpensive, noncomplex mechanism for reducing accumulation of positioning errors. There also exists a need for a substrate processing approach that better lends itself to automation, has improved throughput, and more easily scales for varying wafer sizes.

SUMMARY OF THE INVENTION

The invention generally relates to pallets adapted for holding substrates during processing and to substrate processing machines adapted to employ the substrate processing pallets. According to one embodiment, a substrate processing pallet according to the invention provides features for maintaining improved substrate alignment during processing. According to further embodiments, the substrate processing pallet of the invention provides features for facilitating the loading of substrates onto the pallet; thus, simplifying the handling of substrate batches. According to a further feature, the processing pallet of the invention can accommodate substrates of varying sizes.

In one embodiment, a substrate processing pallet according to the invention has a top surface, a bottom surface and a plurality of side surfaces. The top surface has at least one recess adapted to receive a substrate. Each recess includes a support structure adapted to contact a portion of the substrate during processing. Each recess also includes a plurality of apertures. In one embodiment, during operation, a substrate processing machine initially extends lift pins through the apertures. A robot arm places a substrate onto the lift pins. The processing machine then retracts the lift pins to deposit the substrate onto the support structure of the recess. According to a further feature, each recess is chamfered to facilitate seating the substrate in the recess and on the support structure.

According to another feature, the substrate processing pallet includes a plurality of recesses and can accommodate a batch of substrates. According to a further embodiment, each recess has a particularly shaped outer edge portion adapted to interfit with a correspondingly shaped outer edge portion of a substrate to particularly align the substrate in the recess. According to an additional feature, each recess includes a protuberance adapted to interfit with a notch in a substrate to particularly align the substrate in the recess. In an alternative embodiment, each recess includes a flat outer edge portion adapted to interfit with a similarly flat outer edge portion of a substrate to particularly align the substrate in the recess.

According to another aspect of the invention, the recess has a bottom surface and the support structure includes a shoulder formed along a periphery of the recess and raised with respect to the bottom surface. In one embodiment, the shoulder maintains a gap between a bottom surface of the substrate and the bottom surface of the recess; thus, avoiding potentially damaging contact between the bottom surface of the recess and the bottom surface of the substrate, which may be populated with various devices. According to an additional feature, the shoulder also provides a path of thermal conductivity between the substrate and the substrate processing pallet. In a further embodiment, the alignment pin apertures are located in the support structure shoulder.

According to one embodiment, at least one of the side surfaces has a process positioning feature adapted to interfit and engage with a process chamber feature located inside of a process chamber to particularly position the pallet, and thus, the substrates on the pallet, within the process chamber. According to one embodiment, these features interoperate to effect lateral positioning. In another embodiment, the features engage to effect rotational positioning. According to a further feature, a first one of the side surfaces has a first transport positioning feature adapted to interfit and engage with a first end effector alignment feature of a first transport mechanism to particularly position the pallet, and thus, the substrates on the pallet, with respect to the first end effector. According to one embodiment, these features interoperate to effect rotational alignment. In another embodiment, the features interoperate to effect lateral alignment. According to another feature, the first side surface also has one or more first support features, each adapted to interfit and engage with a corresponding first end effector support feature of the first transport mechanism to support the pallet on the first end effector during transport.

According to another embodiment, a second one of the side surfaces has a second transport positioning feature adapted to interfit and engage with a second end effector alignment feature of a second transport mechanism to particularly position the pallet, and thus, the substrates on the pallet, with respect to the second end effector. According to one embodiment, these features interoperate to effect rotational alignment. In another embodiment, the features interoperate to effect lateral alignment. According to another feature, the second side surface also has one or more second support features, each adapted to interfit and engage with a corresponding second end effector support feature of the second transport mechanism to support the pallet on the second end effector during transport.

According to one embodiment, while the pallet is located in a load lock, a robot arm places substrates onto lift pins extending through apertures in each of the recesses. The lift pins then retract to seat each substrate on the support structure of each recess. The end effector of the first transport mechanism engages the substrate processing pallet via the first support and transport alignment features to transport the pallet from the load lock to a first process chamber. During such transport, the first end effector alignment feature slidingly interfits and engages with the first transport position feature to position the substrate processing pallet with respect to the first end effector. Also, the first end effector support features slidingly interfits and engages with the support features located in the first side surface.

A multistage elevator located below the first process chamber and including an elevator platform located inside of the first process chamber is adapted to receive the first transport mechanism. In one embodiment, the multistage elevator platform includes lower and upper elevator stages, wherein the upper stage is vertically aligned and separated from the lower stage. Each of the lower and upper elevator stages are adapted to support a substrate processing pallet and to accept the first transport mechanism. According to a further feature, each of the lower and upper elevator stages include at least one of the previously mentioned process chamber features adapted to engage with the process alignment feature or features located on one or more side surfaces of the substrate processing pallet.

In one embodiment, the first transport mechanism transports the substrate processing pallet between the load lock and the first process chamber. As the first transport mechanism transports the substrate processing pallet into the first process chamber, the multistage elevator raises the elevator platform to support the substrate processing pallet on the upper elevator stage. As the multistage elevator platform rises, one or more process chamber features located on the upper elevator stage rise to slidingly engage with corresponding process positioning features located on one or more side surfaces of the substrate processing pallet. According to one embodiment, the process positioning features on the side surfaces are chamfered notched apertures and the process chamber features are horizontally oriented, cylindrically shaped positioning pins, wherein a substantially cylindrically shaped side surface of each pin interfits and engages with each notched process position feature as the multistage elevator platform rises to support the substrate processing pallet. In a further embodiment, the first transport mechanism retracts subsequent to the multistage elevator platform assuming support of the substrate processing pallet.

According to a further embodiment, a second process chamber couples to the first process chamber, and the multistage elevator platform is further adapted to receive a second transport mechanism adapted to transport the substrate processing pallet between the first chamber and the second chamber. In one embodiment, the multistage elevator aligns the second side surface of the substrate processing pallet with a second end effector of the second transport mechanism. The second end effector then engages the substrate processing pallet via the second support and transport alignment features to transport the pallet from the first process chamber to the second process chamber.

During such transport, the second end effector alignment feature slidingly interfits and engages with the second transport position feature to position the substrate processing pallet with respect to the second end effector. Also, the second end effector support features slidingly interfits and engages with the support features located on the second side surface. As the second transport mechanism supports the substrate processing pallet on the second end effector, the multistage elevator lowers the elevator platform to disengage the process chamber features located on the upper elevator stage from the corresponding process positioning features located on one or more side surfaces of the substrate processing pallet.

According to one embodiment, the end effector alignment features are tapered to facilitate sliding engagement with chamfered, notched transport positioning features. In a further embodiment, each notched transport positioning feature is substantially centrally located along a longitudinal axis of the side surface on which it is located. In this way, thermal expansion and contraction of the substrate processing pallet tends to effect the position of the pallet with respect to the end effector symmetrically. According to another feature, the support features of the substrate processing pallet are sized and positioned such that thermal expansion and contraction of the substrate processing pallet causes substantially no mechanical stresses to occur between the pallet support features and the end effector support features with which the pallet support features interfit and engage.

In one embodiment, the substrate processing machine is adapted to concurrently transport a batch of substrates contained on a pallet while processing another batch of substrates contained on another pallet. According to a further embodiment, the substrate processing machine is adapted to perform repetitive cycles of such concurrent processing. In one such embodiment, the substrate processing machine begins in an initial state with a first substrate processing pallet in a load lock, a second processing pallet in a first process chamber and a third processing pallet in a second process chamber (with the first, second and third pallets not containing any substrates) and ends with removal of processed substrates from the load lock.

According to one embodiment, the first pallet is supported by the end effector of the first transport mechanism in the load lock, the second pallet is located in the upper stage of the elevator platform in the first processing chamber and the third pallet is supported by the end effector of the second transport mechanism inside of the second process chamber. According to a further aspect, a pin elevator raises a pin platform to extend the lift pins through lift pin apertures of the recesses of the first processing pallet. The robot arm then transfers substrates onto the lift pins of each recess of the first substrate processing pallet. The pin elevator then lowers the pin plate to retract the lift pins through the lift pin apertures of the first processing pallet; thus, lowering the substrates into the recesses of the first processing pallet.

According to another aspect, either prior to, subsequent to, or concurrently with loading substrates onto the first processing pallet, a multistage elevator aligns the lower stage of the elevator platform with the second end effector. The second transport then extends the second end effector to place the third pallet in vertical alignment with the lower stage of the elevator platform. Subsequent to such alignment, the elevator raises the elevator platform to bring the lower stage of the elevator platform into supporting contact with an underside of the third pallet, and to interfit and engage the process chamber alignment features located on the lower stage of the elevator platform with the process alignment features of the third pallet. According to a further embodiment, subsequent to the lower stage being brought into contact with the underside of the third pallet, the second transport retracts the second end effector back into the second process chamber.

According to a further feature, the second transport next extends into the first process chamber to remove the second pallet from the upper stage of the elevator platform. According to one embodiment, the elevator aligns the upper level of the elevator platform with the second end effector. The second transport then extends the second end effector to engage the second pallet with the support and alignment features of the second end effector. Once the second end effector is positioned to support the second pallet, the elevator raises the elevator platform to disengage the chamber features located on the upper stage of the elevator platform from the process alignment features located on the second substrate. Subsequent to disengagement, the second transport retracts the second end effector and thus, the second processing pallet into the second process chamber.

Next, according to a further embodiment, the first pallet transport extends the first end effector to transport the first pallet into the upper stage of the elevator platform. Subsequent to the first end effector vertically aligning the first pallet above the upper, the multistage elevator raises the elevator platform to bring the upper stage of the elevator platform into supporting contact with a bottom surface of the first pallet. Raising the elevator platform also causes the process chamber alignment features located on the upper stage of the elevator platform to interfit and engage with the process alignment features of the first pallet. Once the upper stage of the elevator platform assumes support of the first pallet, the first transport retracts to remove the first end effector from the first process chamber.

Next, according to a further embodiment, the first transport extends into the first process chamber to remove the third pallet from the lower stage of the elevator platform. According to one embodiment, the elevator aligns the lower level of the elevator platform with the first end effector. The first transport then extends the first end effector into the first process chamber to engage the third pallet with the support and alignment features of the first end effector. Once the first end effector is positioned to support the third pallet, the elevator raises the elevator platform to disengage the chamber alignment features located on the lower stage of the elevator platform from the process alignment features located on the third pallet. Subsequent to disengagement, the first transport retracts the first end effector and thus, the third pallet into the load lock.

With the first pallet now being the sole pallet inside of the first process chamber, the substrate processing machine, in one embodiment, cleans the batch of substrates contained on the first pallet. According to a further embodiment, concurrently with cleaning the substrates contained on the first pallet, the robot arm loads a batch of substrates onto the third pallet in the load lock according to the same process described above with respect to loading substrates onto the first pallet. Upon completion of the cleaning batch of substrates contained on the first pallet, the second transport transports the second pallet from the second process chamber into the lower stage of the elevator platform according to the same method described above for the transfer of the third pallet from the second process chamber to the first process chamber. Next, the second transport transports the first pallet, according to the same process described above with respect to the transport of the second pallet, from the upper stage of the elevator platform into the second process chamber. According to a further operational feature, the substrate processing machine then begins deposition processing the batch of substrates contained on the first pallet in the second process chamber.

According to a further feature of the invention, concurrently with the deposition processing of the substrate batch contained on the first pallet, the first transport transports the third pallet from the load lock to the upper stage of the elevator platform according to the same method described above for the transfer of the first pallet from the load lock into the first process chamber. Next, the first transport transports the second pallet from the lower stage of the elevator platform into the load lock according to the same method described above with respect to transferring the second pallet from the first process chamber into the load lock.

According to a further embodiment, concurrently with the deposition processing of the substrate batch contained on the first pallet, the substrate processing machine also cleans the batch of substrates contained on the third pallet in the first process chamber. In another aspect, concurrent with the deposition and cleaning, the robot arm loads a batch of substrates into the second pallet.

According to an additional embodiment, upon completion of the deposition processing in the second process chamber and the cleaning processing in the first process chamber, the second transport transports the first pallet into the lower stage of the elevator platform, according to the same method employed above to transfer the third pallet from the second process chamber to the first process chamber. Next, the second transport transports the third pallet from the upper stage of the elevator platform into the second process chamber according to the same method described above with respect to transporting the second pallet from the first process chamber into the second process chamber.

In one operational embodiment, concurrently with the substrate processing machine performing deposition processing in the second process chamber on the substrate batch contained on the third pallet, the first transport transports the second pallet from the load lock to the upper stage of the elevator platform according to the same method described above with respect to transporting the first pallet from the load lock into the first process chamber. Next, the first transport transports the first pallet from the lower stage of the elevator platform into the load lock according to the same method as described above for transporting the second pallet from the first process chamber into the load lock.

According to an additional processing aspect, concurrently, with the substrate processing machine deposition processing the substrate batch contained on the third pallet in the second process chamber and cleaning the substrate batch contained on the second pallet in the first process chamber, the robot arm removes the batch of processed substrates from the pallet to storage and reloads another batch of substrates onto the first pallet to begin the next processing cycle.

The above and further advantages of the invention may be better understood by referring to the following description taken in conjunction with the accompanying drawings, in a which depicted element may not be drawn to scale, like elements are referenced with like reference designations and in which:

BRIEF DESCRIPTION OF THE DRAWINGS

FIG. 2A is a perspective view of a portion of the inline processing machine of FIG. 1;

FIG. 2B is a detail view depicting lift pins supporting a substrate according to an illustrative embodiment of the invention;

FIG. 3A is a top, perspective view of a substrate processing pallet according to an illustrative embodiment of the invention;

FIG. 3B is a top, perspective, detail view of an illustrative transport positioning feature located on the processing pallet of FIG. 3A;

FIG. 3C is a top, perspective, detail view of an illustrative support feature located on the processing pallet of FIG. 3A;

FIG. 3D is a top, perspective, detail view of an illustrative process positioning feature located on the processing pallet of FIG. 3A;

FIG. 3E is a detail cross sectional view along the line AA of an illustrative recess located on the processing pallet of FIG. 3A.

FIG. 7A is a top, perspective view of a portion of a transport mechanism of the substrate processing machine of FIG. 1, supporting the substrate processing pallet of FIG. 3A and adapted for transporting substrate processing pallets between a load lock and a first process chamber;

FIG. 7B is a detail, perspective view of an end effector alignment feature according to an illustrative embodiment of the invention;

FIG. 9A is a perspective view of a multistage elevator platform according to an illustrative embodiment of the invention;

FIG. 9B is a detail, perspective view of process chamber features according to an illustrative embodiment of the invention and adapted to engage with the illustrative process positioning features of FIGS. 3D and 4D;

FIG. 10A is a perspective view the illustrative multistage elevator platform of FIG. 9A supporting two illustrative substrate processing pallets of the type depicted in FIG. 3A;

FIG. 10B is a detail, perspective view depicting the engagement of the process chamber features of FIG. 9B with the process positioning features of FIGS. 3D and 4D according to an illustrative embodiment of the invention.

DESCRIPTION OF THE ILLUSTRATIVE EMBODIMENTS

As discussed above in summary, in one embodiment, the invention is directed to pallets adapted for holding substrates during processing. In other embodiments, the invention is directed to methods of employing the substrate processing pallets. In still other embodiments, the invention is directed to substrate processing machines adapted to employ such pallets. The term substrate, as used herein refers generally to wafer substrates used, for example, in semiconductor processing.

Figure 1:
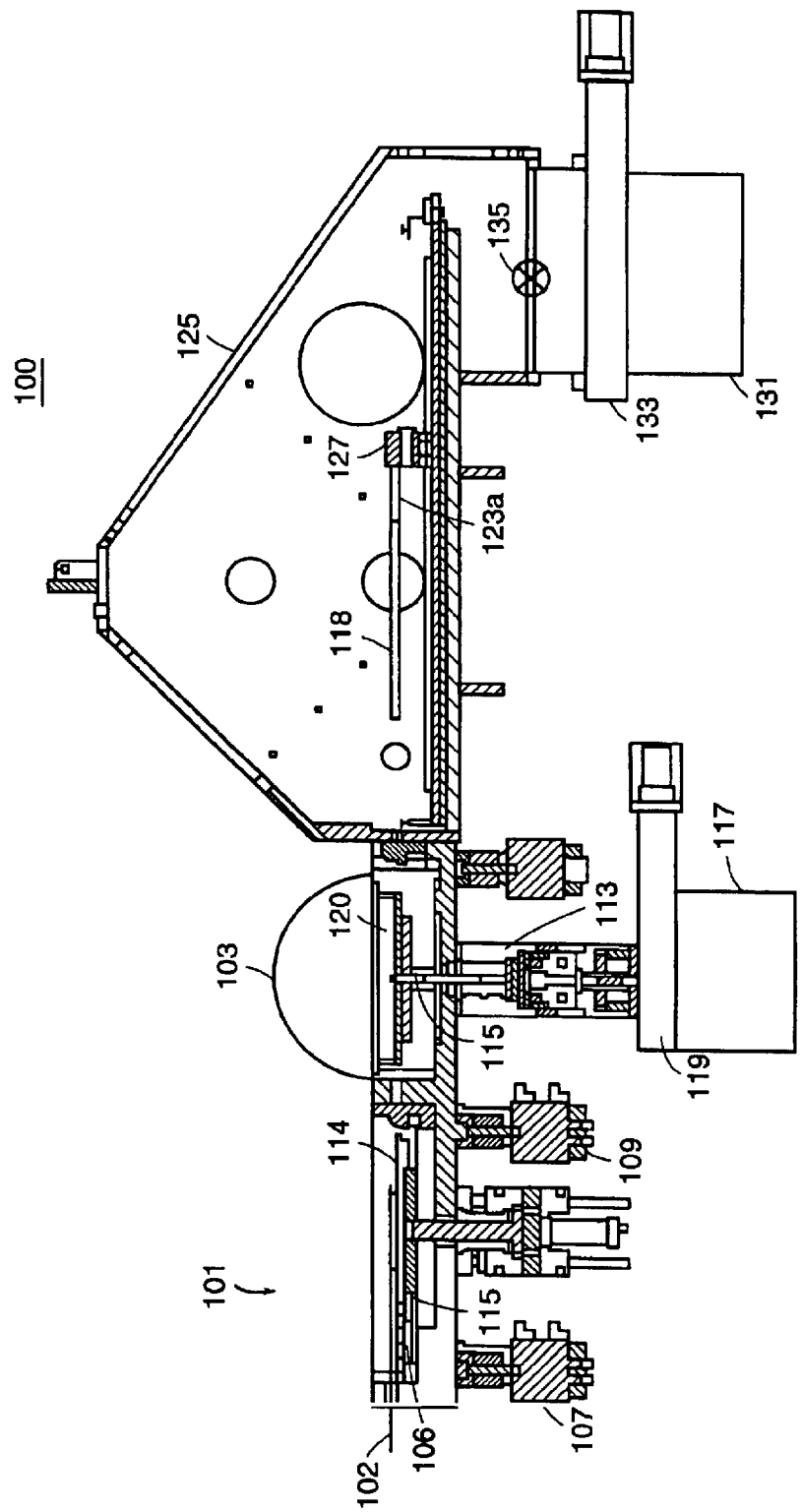
FIG. 1 is a cross-sectional view of a portion of an inline substrate processing machine having illustrative features of the invention.

FIG. 1 is a side, schematic view of an inline substrate processing machine 100, adapted to employ the substrate processing pallets 114 of the invention to concurrently transport and process a plurality of substrates, such as the substrate 104 (shown in FIG. 2A), according to an illustrative embodiment of the invention. FIG. 2A is a top, perspective, schematic view of a portion of the substrate processing machine 100. The substrate processing machine 100, depicted in an intermediate state of operation, includes a load lock 101, a first process chamber 103 and a second process chamber 125. In such a state of operation, the load lock 101, the first process chamber 103 and the second process chamber 125 contain substrate processing pallets 114, 116 and 118, respectively. According to the illustrative embodiment of the invention, the pallets 114, 116 and 118 are substantially identical and interchangeable. The pallet 114 is in the process of being loaded with substrates, such as the substrate 104, while the pallets 116 and 118 are fully loaded and in various states of processing. As mentioned in summary above, and as discussed in further detail below, one advantage of the substrate processing pallets 114, 116 and 118 is that they are adapted to interoperate with features of the substrate processing machine 100 to enable the machine 100 to process batches of substrates carried on each of the pallets 114, 116 and 118 concurrently. Since, the pallets 114, 116 and 118 are substantially identical and interchangeable, for clarity and simplicity, the description below is directed to the exemplary features of the pallet 114.

Referring to FIGS. 1 and 2A, in operation, the load lock 101 stores pre- and post-processing substrates and acts as an interface chamber between the first process chamber 103 and a substrate handling robot (not shown) having a robot arm 102. The substrate handling robot is a conventional device, such as, for example, the Gencobot™ model number 7/2L-S, available from Genmark. Illustratively, the load lock 101 is an evacuatable chamber defined by the first and second slot valves 107 and 109. The slot valve 107 is located at an end of the load lock 101 proximate to the robot arm 102 and is adapted to atmospherically isolate the load lock 101 from the substrate handling robot. The slot valve 109 is located a an end of the load lock 101 proximate to the first process chamber 103, and is adapted to atmospherically isolate the load lock 101 from the first process chamber 103. In the illustrative embodiment, the first and second slot valves 107 and 109, respectively, are flapper valves. The substrate processing machine 100 also includes a vacuum pump (not shown) adapted to evacuate the load lock chamber 101 in preparation for processing the substrates located on the pallet 114.

In the illustrative embodiment, the robot arm 102 loads substrates, such as the substrate 104, onto the substrate processing pallet 114 while the pallet 114 is located within the load lock 101. While in the load lock 101, the robot arm 102 deposits the substrates, into recesses in the pallet 114, such as the recesses 105a–105e. More particularly, and as illustrated at the recess 105c and in detail in FIG. 2B, the robot arm 102 deposits the substrate 104 onto lift pins, such as the lift pins 112a–112d, located around the periphery of the recess 105d and extending through lift pin apertures (shown at 208a–208e in FIG. 3A). The lift pins 112a–112d are adapted to receive the substrate 104 and suspend the substrate 104 over the recess 105d. Suspending the substrate 104 over the recess 105d enables the robot arm 102 to withdraw after placing the substrate 104 onto the recess lift pins 112a–112d and to remove the substrate 104 from the pallet 114 subsequent to processing.

As discussed in further detail below with respect to FIG. 6, after the robot arm 102 places substrates on the lift pins of each of the recesses 105a–105d of the pallet 114, a pin elevator drive mechanism 111 lowers an alignment pin plate 115 to withdraw concurrently the recess lift pins, such as the lift pins 112a–112d, from the lift pin apertures of each recess 105a–105d; thus, lowering the substrates into the recesses 105a–105d. After the substrates are processed and the pallet 114 returns to the load lock 101, the pin elevator drive mechanism 111 raises the alignment pin plate 115 to extend the lift pins through the lift pin apertures of each recess 105a–105d to raise the substrates above each recess 105a–105d to enable the robot arm 102 to remove the processed substrates to storage.

As mentioned above, the load lock 101 mechanically couples to the first process chamber 103 and the first process chamber 103 mechanically couples to the second process chamber 125. As discussed in more detail below with respect to FIGS. 7A–7C and 11, and in a similar fashion to the substrate processing machine of U.S. Pat. No. 6,217,272, the illustrative substrate processing machine 100 contains two substantially identical transport mechanisms 700 and 1100 depicted in FIGS. 7 and 11, respectively. The pallet transport mechanism 700 transports substrate processing pallets, such as the pallet 114, between the load lock 101 and a multi-stage elevator platform 120 located within the first process chamber 103, while the transport mechanism 1100 transports substrate processing pallets between the multi-stage elevator platform 120 and the second process chamber 125.

The pallet transport mechanism 700 includes an end effector 106. The end effector 106 includes pallet support features 110a and 110b, which are adapted to interfit and engage slidingly with support features 214a and 214b located on a first side surface 114a of the substrate processing pallet 114, to support the substrate processing pallet 114 on the end effector 106. The end effector 106 also includes a centrally positioned locating feature 108 adapted to interfit and engage slidingly with a transport positioning feature (shown at 216a in FIG. 3) also located on the side surface 114a of the substrate processing pallet 114. Preferably, each time the substrate transport mechanism 700 loads a substrate transport pallet 114, the locating feature 108 engages with the transport positioning feature 216a to locate the substrate transport pallet 114 in substantially the same position relative to the end effector 106. In this way, the locating feature 108 on the end effector 106 and the positioning feature 216a on the substrate 114 are adapted to interoperate to align the substrates 105a–105d prior to processing in the first chamber 103.

In the illustrative embodiment, the first process chamber 103 is a cleaning chamber, such as a sputter cleaning chamber, which prepares the substrates 104 for further processing. A multi-stage elevator 113 is positioned under the first process chamber 103, and couples to the multi-stage elevator platform 120 via a drive mechanism 115. The multi-stage elevator platform 120 has at least two vertically aligned and separated stages (shown at 120a and 120b of FIGS. 8–12 and discussed in more detail below with respect to those figures). Each stage 120a and 120b is adapted to support a substrate processing pallet, such as the pallet 114. The multi-stage elevator 113 vertically positions the multi-stage elevator 113 via the drive mechanism 115. The drive mechanism 115 may be any drive mechanism known in the art. A vacuum pump 117, such as a cryogenic vacuum pump, couples to the bottom of the first process chamber 103 via a gate valve 119. The vacuum pump 117 evacuates the first process chamber 103 to a high vacuum.

The second process chamber 125 couples to the first process chamber 103 through a flapper valve 134. In the illustrative embodiment, the second process chamber 103 is a multi-layer deposition chamber. In one illustrative embodiment, the second process chamber 125 is a sputter deposition chamber, such as the chamber 42 of U.S. Pat. No. 6,217,272. However, in other embodiments, other types of deposition chambers, such as, chemical vapor deposition may be employed. A vacuum pump 131, such as a cryogenic vacuum pump, couples to the second process chamber 125 by way of a gate valve 133. The vacuum pump 131 evacuates the second process chamber 125 to a high vacuum. A throttle valve 135 changes the conductance to the vacuum pump 131, and thus, the process gas pressure inside of the second process chamber 125.

As mentioned above, the transport mechanism 1100 is adapted to transport substrate processing pallets, such as the pallets 114, 116 and 118, between the first process chamber 103 and the second process chamber 125 is located within the second process chamber 125. In a similar fashion to the first transport mechanism 700, the second transport mechanism 1100 includes an end effector 126. The end effector 126 includes substrate pallet support features 123a and 123b, which are adapted to interfit and engage slidingly with the support features 214c and 214d located on a second side surface 114b of the substrate processing pallet 114, to support the substrate processing pallet 114 on the end effector 126. The end effector 126 also includes a centrally positioned locating feature 124 adapted to interfit and engage slidingly with a transport positioning feature (shown at 216b in FIG. 4A) also located on the side surface 114b of the substrate processing pallet 114. Preferably, each time the substrate transport mechanism 1100 loads a substrate transport pallet 114, the locating feature 124 interfits and engages slidingly with the transport positioning feature 216b to locate the substrate transport pallet 114 in substantially the same position relative to the end effector 126. In this way, the locating feature 124 on the end effector 126 and the positioning feature 216b on the substrate 114 are adapted to interoperate to align the substrates 105a–105d prior to processing in the second chamber 125. The substrate pallet transport mechanism 1100 is discussed in further detail below with reference to FIG. 11.

FIG. 3A is a top, perspective view of the illustrative substrate transport pallet 114. FIG. 4A is a bottom perspective view of the illustrative substrate transport pallet 114. FIGS. 3B–3D and 4B–4D provide detail views of various aspects of the pallet 114. As mentioned above, since the substrate pallets 114, 116 and 118 are substantially identical and interchangeable, all of the features discussed with respect to the pallet 114 are also present with respect to the pallets 116 and 118. In the illustrative embodiment, the substrate transport pallet 114 is fabricated from an aluminum alloy, such as Aluminum Alloy #6061. However, the substrate transport pallet 114 may be manufactured from stainless steel, titanium, graphite, or other suitable material.

Preferably, the substrate processing pallet 114 is fabricated from one or more electrically and thermally conductive materials to facilitate substrate processing by the processing machine 100. According to a further feature, the illustrated substrate processing pallet is fabricated from a material that capacitively couples radio frequency (RF) energy from the recesses 105a–105d to the under sides of substrates contained within each recess.

Referring to FIGS. 3A–3D and 4A–4D, the substrate transport pallet 114 is typically rectangular in shape and has a top surface 202, which is substantially flat. In one embodiment, the substrate transport pallet 114 is milled into an appropriate shape. In another embodiment, the substrate transport pallet 114 is cast in a suitable mold. The substrate transport pallet 114 includes at least one recess, such as the recesses 105a–105d. Illustratively, the substrate processing pallet 114 has four recesses 105a–105d. Depending on the diameter of the substrate 104 to be accommodated, any desired number of recesses, such as the recesses 105a–105d, can be fabricated into the substrate transport pallet 114. The size (e.g., diameter) of the recesses included in the pallet 114 are limited by the size of the pallet 114 and by the largest diameter of the substrates 104 to be processed. In the illustrative embodiment, the recesses 105a–105d are substantially identical. Thus, for simplicity, the recess 105d is described as an illustrative example. The recess 105d has a diameter large enough to accommodate a substrate having a diameter of about 150 millimeters and includes a flat portion 206 along its circumference. The substrates, such as substrate 104, each have a corresponding flat portion along their circumference. A flat finder, such as known in the art, locates and orients the substrate 104 prior to the substrate 104 being loaded onto the lift pins 112a–112d. The flat portion 206 in the recess 105d is adapted to interfit with the flat portion on the substrate 104. Skilled artisans will appreciate that substrates having various dimensions and multiple flats or, alternatively, notches may also be employed without departing from the scope of the invention.

FIG. 3E is a cross-sectional, detail view of a peripheral portion of the recess 105d. As shown, the recess 105d includes a bottom surface 204 and a support shoulder 210. The support shoulder 210 is raised relative to the bottom surface 204 and preferably extends around the entire periphery 211 of the recess 105d. However, in alternative embodiments, the support shoulder 210 extends around only portions of the periphery 211, and thus, only contacts portions of the peripheral underside of the substrate 104. With the substrate 104 seated on the support shoulder 210 in the recess 105d, the support shoulder 210 creates a gap between the bottom surface 204 of the recess 105d and an under surface of the substrate 104. The gap so created avoids potentially damaging contact between the under surface of the substrate 104, which may be populated with various devices, and the bottom surface 204 of the recess 105d.

According to a further feature, the support shoulder 210 contacts a peripheral portion of the underside of the substrate 104 to create a sufficient seal to inhibit exposure of the underside of the substrate 104 to any compounds contained in the first 103 and second 125 process chambers. According to another feature, the support shoulder 210 provides a path of thermal and electrical conductivity between the processing pallet 114 and the substrate 104.

As shown in FIG. 3E, the recess 105d also includes a chamfered interface ring 212 between the circumferential outer edge 211 and the support shoulder 210. The chamfered interface ring 212 facilitates seating of the substrate 104 upon retraction of the lift pins 112a–112d.

The recess 105d also includes through apertures 208a–208d adapted to pass the substrate lift pins 112a–112d, respectively. In one embodiment, the centers of the through apertures 208a–208d are located near the circumferential outer edge 211 of the recess 105d such that the substrate lift pins 112a–112d contact only a peripheral portion of the substrate 104. In another embodiment, the centers of the through apertures 208a–208d are located less than about four millimeters from the circumferential outer edge 211 of the recess 105d and pass through the support shoulder 210. Although four through apertures 208a–208d corresponding to the four substrate lift pins 112a–112d are shown, skilled artisans will appreciate that, depending on the shape and size of the through apertures and the lift pins, and the shape of the robot arm 102 any number of through apertures and corresponding substrate lift pins may employed without deviating from the scope of the invention.

The illustrative substrate transport pallet 114 includes four pallet support features: 214a and 214b, located on the side surface 114a; and 214c and 214d, located on the side surface 114b. As shown in FIGS. 3C and 4C, in the illustrative embodiment, the features 214a–214d are substantially identical elongated notched or slotted apertures having rounded edges 230a and 230b. In the illustrative embodiment, the features 214a–214d are depicted as being open ended (e.g., U-shaped). However, this need not be the case.

As mentioned above with respect to FIGS. 1 and 2A, the support features 214a and 214b are particularly shaped to interfit and engage slidingly with the end effector support features 110a and 110b, respectively, of the end effector 106. Similarly, the support features 214c and 214d are particularly shaped to interfit and engage slidingly with the end effector support features 123a and 123b of the end effector 126. As discussed in further detail with respect to FIGS. 7A–7D, the illustrative support features 110a, 110b, 123a and 123b are shaped as elongated bars having a substantially rectangular cross-section and tapered/wedge shaped end portion 122 adapted to facilitate intermitting and engagement with the corresponding features 214a–214d of the pallet 114.

The location and dimensions of the substrate pallet support features 214a–214d are determined based, at least in part, on the thermal expansion characteristics of the material of the substrate transport pallet 114. By way of example, in the illustrative embodiment, the size and placement of the support features 214a–214d are selected such that under maximum thermal expansion and contraction conditions experienced during substrate processing, the features 214a–214d do not interoperate with corresponding end effector features 110a, 110b, 123a and 123b to cause temperature-related mechanical stresses to be placed on either the end effectors 106 or 126 or the pallet 114. Although the pallet 114 is depicted with two support features per side 114a and 114b, varying numbers, sizes and shapes of support features may be manufactured into the substrate transport pallet 114 without departing from the scope of the invention.

With reference again to FIGS. 1–2B, as the pallet transport mechanism 700 transports the substrate processing pallet 114 between the load lock 101 and the first process chamber 103, and as the pallet transport mechanism 1100 transports the processing pallet 114 between the first process chamber 103 and the second process chamber 125, undesirable translational and/or rotational misalignment of the pallet 114 and thus, the substrates 105a–105d tends to accumulate in conventional processing machines. The illustrative processing pallet 114 and processing machine 100 reduces this accumulation by employing various inventive mechanisms.

One such mechanism is the transport locating features 216a and 216b provided on the side surfaces 114a and 114b, respectively, of the substrate transport pallet 114. As shown in FIG. 4A, the transport locating feature 216a is substantially centrally located longitudinally along the side surface 114a, and the transport locating feature 216b is substantially centrally located longitudinally along the side surface 114b. As mentioned above, due to the central location of the transport locating features 216a and 216b, lateral thermal expansion and contraction of the pallet 114 tends to effect the pallet 114 symmetrically about an axis 220 drawn through the locating features 216a and 216b and bisecting the pallet 114.

Figure 4B:
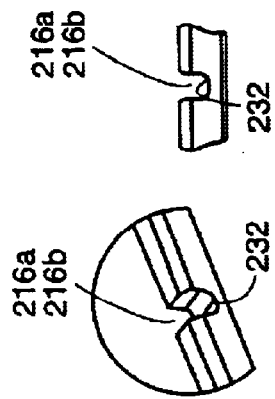
FIG. 4B is a bottom, perspective, detail view of an illustrative transport positioning feature located on the processing pallet of FIG. 4A.
Figure 4D:
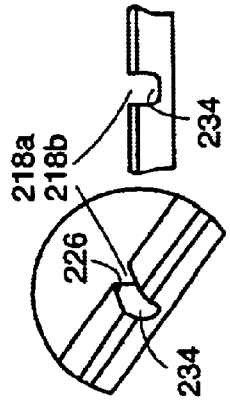
FIG. 4D is a bottom, perspective, detail view of an illustrative process positioning feature located on the processing pallet of FIG. 4A.
Figure 4A:
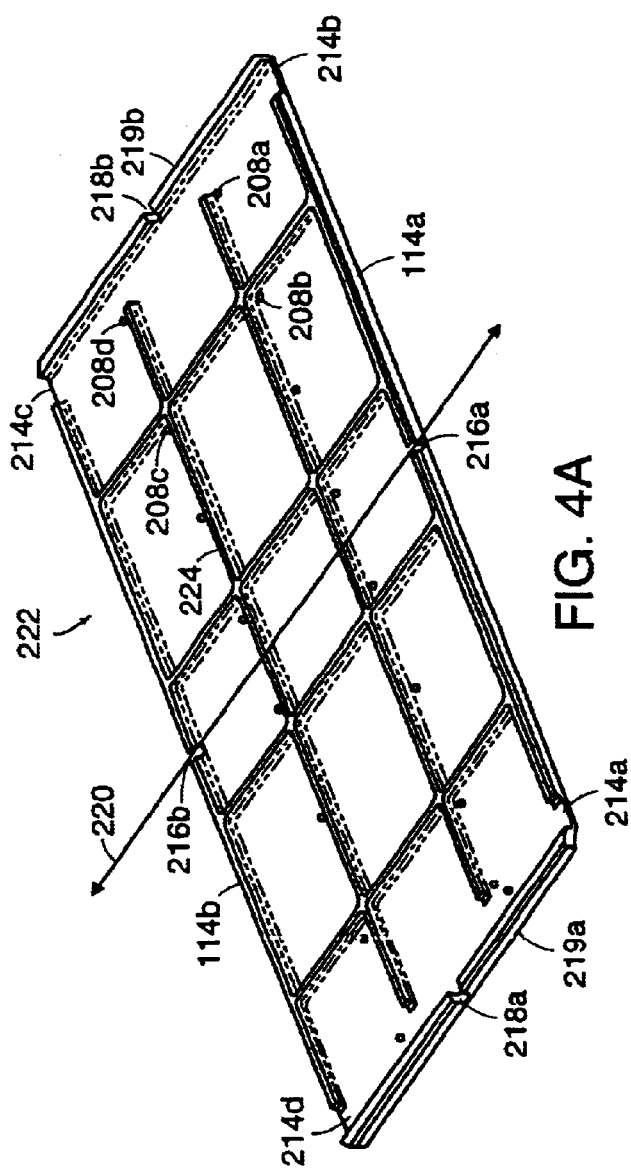
FIG. 4A is a bottom, perspective view of the illustrative substrate transport pallet of FIG. 3.
Figure 4C:
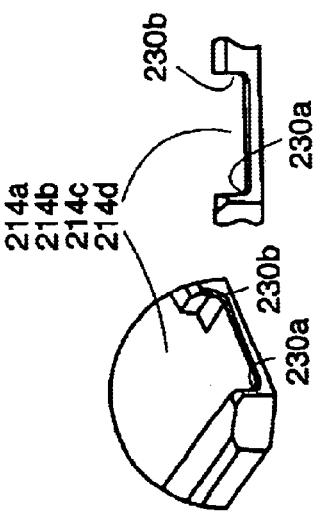
FIG. 4C is a bottom, perspective, detail view of an illustrative support feature located on the processing pallet of FIG. 4A.

As shown in FIGS. 3D and 4D, in the illustrative embodiment, the positioning features 216a and 216b are substantially identical parabolic notched apertures. Although the features 216a and 216b are depicted as being open ended (e.g., U-shaped), this need not be the case. The positioning features 216a and 216b can be any shape that interoperates with the effector alignment features 108 and 124, respectively, to facilitate consistent positioning of the pallet 214. As mentioned above with respect to FIGS. 1 and 2, the transport positioning feature 216a is particularly shaped to interfit and engage slidingly with the end effector alignment feature 108 of the end effector 106. Similarly, the transport positioning feature 216b is particularly shaped to engage slidingly with the end effector alignment feature 124 of the end effector 126. As discussed in further detail with respect to FIGS. 7A–7D, the illustrative end effector alignment features 108 and 124 are shaped as elongated cylinders having a substantially circular cross-section and a tapered end 108a to facilitate engagement with the corresponding transport positioning features 216a and 216b of the pallet 114.

The substrate processing pallet 114 further includes at least one process alignment feature, such as the process alignment feature 218a located on the pallet side surface 219a. In the illustrative embodiment, the processing pallet 114 includes two such process alignment features, 218a located on the side surface 219a and 218b located on the side surface 219b. As discussed in further detail below with respect to FIGS. 8–10B, the alignment features 218a and 218b are adapted to interfit and engage with process chamber features, such as the substantially cylindrically shaped, horizontally oriented, positioning pins 904a–904d, located on the multi-stage elevator platform 120 inside of the first process chamber 103. According to the illustrative embodiment of the invention, such engagement reduces rotational and/or translational misalignment of the processing pallet 114 within the first process chamber 103 due to cumulative mechanical errors resulting, for example, from transport and thermal coefficients of expansion.

As shown in detail in FIGS. 3D and 4D, the illustrative process alignment features 218a and 218b are substantially identical parabolic notched apertures having a curved inner surface 234. Although the features 218a and 218b are depicted as being open ended and curved (e.g., U-shaped), this need not be the case. In alternative embodiments, the positioning features 218a and 218b may be, for example, any shape that engages with the chamber features 904a–904d to facilitate consistent positioning of the pallet 214 within the first process chamber 103. As shown at shown at 226 of FIG. 4D, the notched apertures 218a and 218b further include a chamfered entrance surfaces to further facilitate interfitting and engagement between the notched apertures 218a and 218b and the cylindrical side surfaces of the positioning pins 904a–904d.

In the illustrative embodiment of FIG. 4A, the alignment features 218a and 218b are depicted as being positioned substantially opposite to each other on the side surfaces 219a and 219b. However, in alternative embodiments the alignment features 218a and 218b may be offset with respect to each other. Additionally, in other embodiments, the pallet 114 may contain one or more or no such alignment features 218a and 218b. As skilled artisans will appreciate, the number, position and shape of alignment features, such as the alignment features 218a and 218b, preferably corresponds to the number, shape and position of process chamber features, such as the process chamber features 904a–904d.

As also shown in FIG. 4A, the underside 222 of the illustrative substrate processing pallet 114 includes stiffening members 224. In the illustrative embodiment, the stiffening members 224 are arranged in a grid-like pattern, and are adapted to prevent the substrate transfer pallet 114 from warping or deforming due to mechanical stresses and/or variations in temperature during processing. Alternative stiffening arrangements may be utilized without departing from the scope of the invention. By way of example, in alternative embodiments, independent stiffening materials and/or structures may be suitably attached to the underside 222 of the substrate transport pallet 114.

Figure 5C:
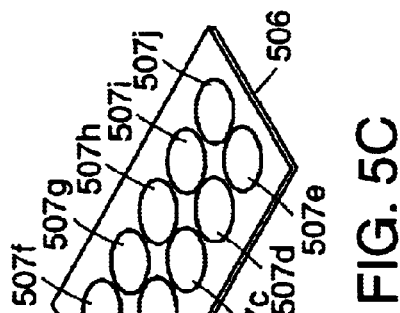
FIGS. 5A–5E are top, perspective views of various configurations of substrate transport pallets according to illustrative embodiments of the invention.
Figure 5E:
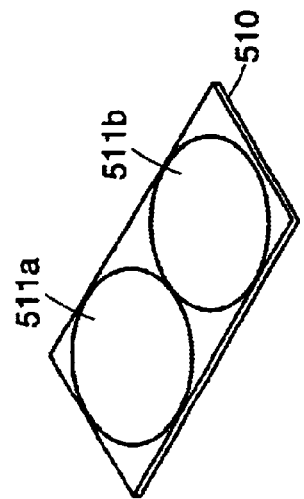
Figure 5B:
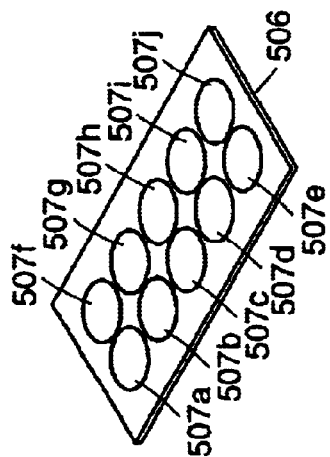
Figure 5D:
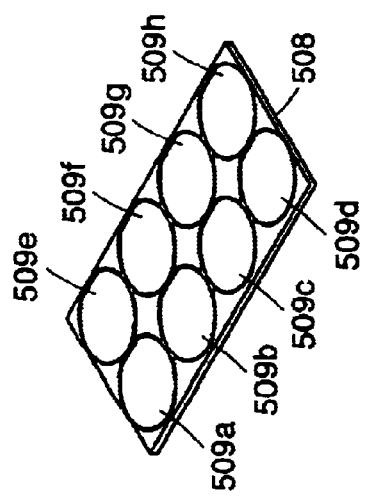
Figure 5A:
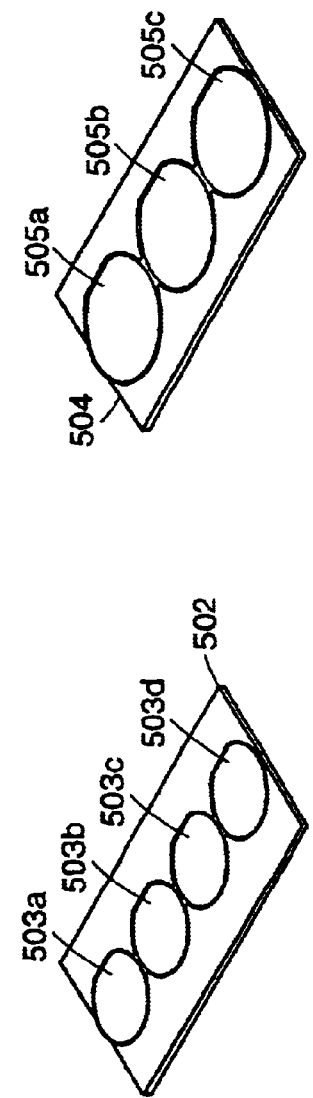

As discussed above, although the substrate processing pallet 114 is depicted as accommodating four substrates, in alternative embodiments, the pallet 114 may accommodate any number of substrates of varying sizes. FIGS. 5A–5E a plurality substrate processing pallet configurations. More particularly, FIG. 5A depicts a pallet 502 having four recesses 503a–503d in a similar fashion to the pallet 114. FIG. 5B depicts a pallet 504 having three recesses 505a–505c, each adapted to accommodate a substrate having a diameter of about 200 millimeters. FIG. 5C depicts a pallet 506 having ten recesses 507a–507j, each adapted to accommodate a substrate having a diameter of about 100 millimeters. FIG. 5D depicts a pallet 508 having eight recesses 509a–509h, each adapted to accommodate a substrate having a diameter of about 125 millimeters. FIG. 5E depicts a pallet 510 having two recesses 511a and 511b, each being adapted to accommodate a substrate having a diameter of about 300 millimeters.

Figure 6:
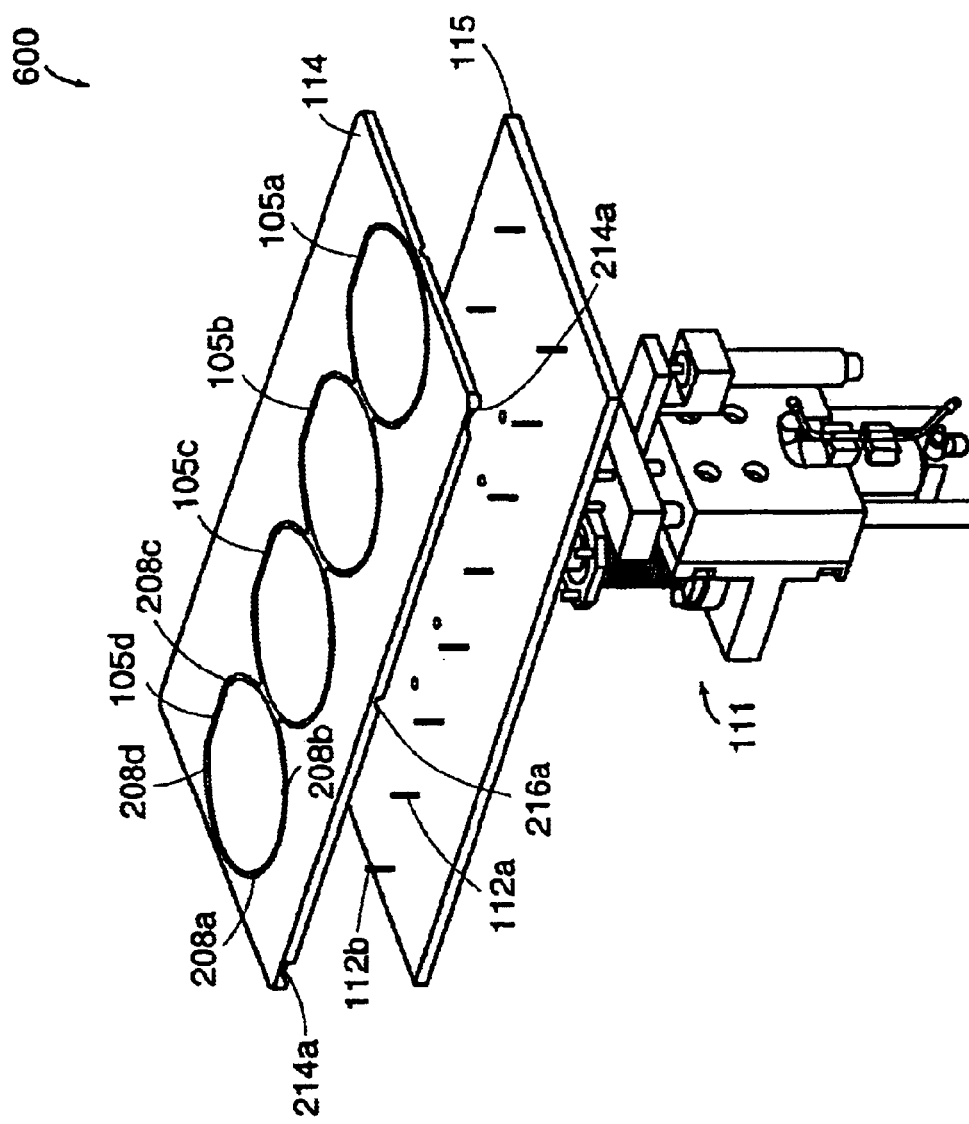
FIG. 6 is a perspective view depicting a substrate processing pallet, lift pin plate and lift pin elevator drive mechanism according to an illustrative embodiment of the invention.

FIG. 6 is a conceptual diagram 600 depicting the substrate processing pallet 114, the pin plate 115 and the pin elevator drive mechanism 111. The pin elevator 111 may be any mechanism known in the art for raising and lowering a plate, such as the pin plate 115. In the illustrative embodiment, the pin elevator 111 is a pneumatic cylinder. Prior to the robot arm 102 loading the substrates onto the pallet 114, the pin elevator mechanism raises the plate 115 to cause lift pins, such as the lift pins 112a–112d, to extend through lift pin apertures, such as the lift pin apertures 208a–208d, in each recess 105a–105d. The robot arm 102 then places a substrate, such as the substrate 104, oriented in a particular fashion, onto the lift pins of each recess 105a–105d. Subsequent to substrates being placed onto the lift pins of each of the recesses 105a–105d, the pin elevator mechanism 111 lowers the pin plate 115 to withdraw concurrently the recess lift pins, such as the lift pins 112a–112d, from the through apertures of the recesses 105a–105d; thus, lowering the substrates into the recesses 105a–105d.

Subsequent to the substrates being processed and returned to the load lock 101, the pin elevator mechanism 111 once again raises the pin plate 115 to cause the lift pins to extend through the lift pin apertures, such as the lift pin apertures 208a–208d, of each of the recesses 105a–105d; thus, raising the substrates onto the lift pins and out of the recesses 105a–105d. The robot arm 102 then removes the processed substrates from each the lift pins of each recess 105a–105c and transfers the substrates to a storage device (not shown) for future use. The substrate 114, with the lift pins extended through the lift pin apertures of each recess 105a–105c is now available for reloading with substrates awaiting processing.

As discussed briefly above, the substrate processing machine employs two pallet transports 700 and 1100. Referring to FIGS. 7A–7C and 11, except that the transport 700 transports pallets, such as the pallet 114, between the load lock 101 and the first process chamber 103, and the transport 1100 transports pallets, such as the pallet 114, between the first process chamber 103 and the second process chamber 125 in the illustrative embodiment, they are substantially identical.

Figure 11:
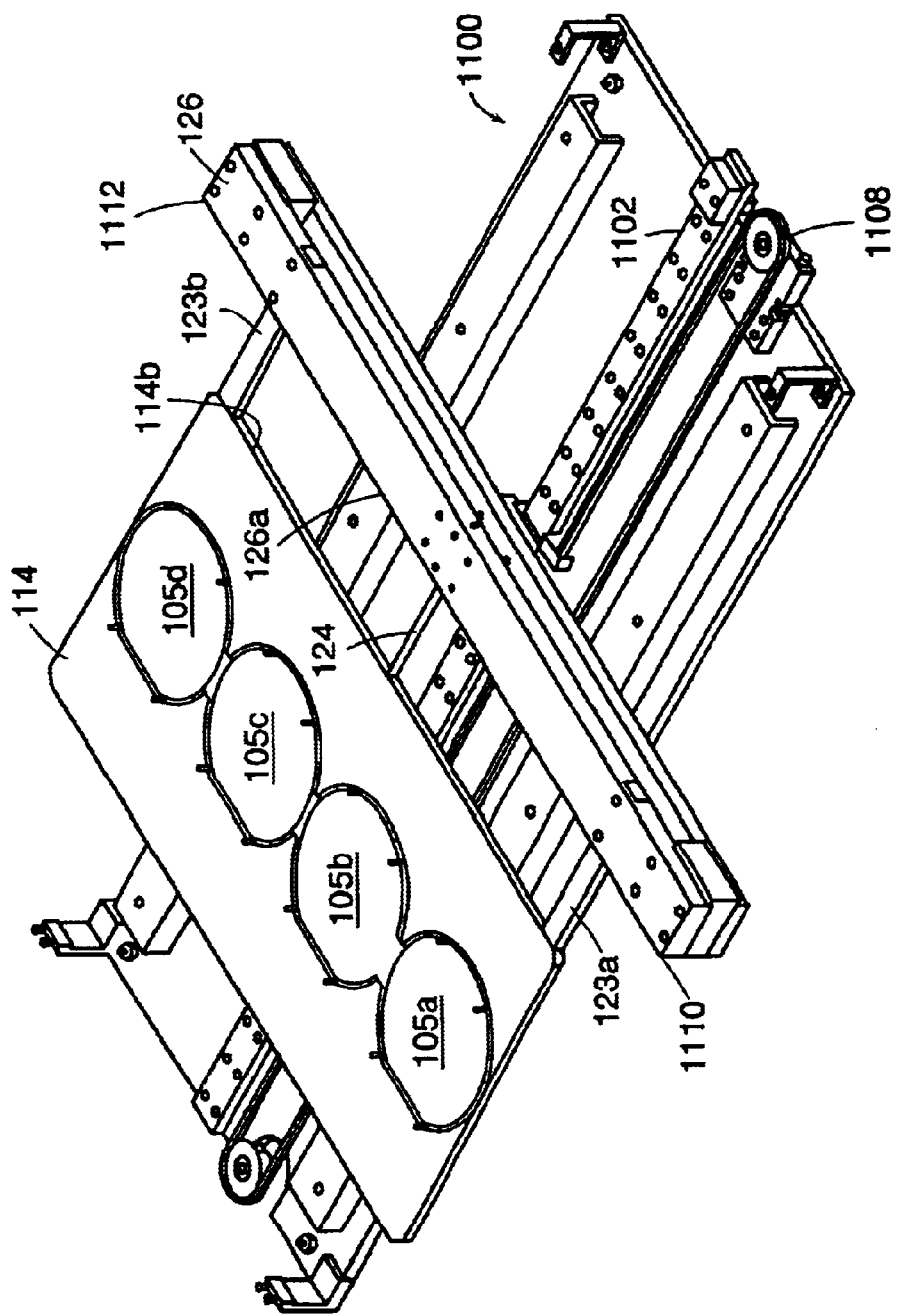
FIG. 11 is a perspective view of an transport mechanism adapted to transport substrate processing pallets of the type depicted in FIGS. 5A–5E between first and second process chambers according to an illustrative embodiment of the invention.

Referring to FIGS. 7 and 11, one difference between the transports 700 and 1100 is that the transport 1100 includes a single bearing rail, such as the rail 1102, upon which the end effector 126 travels. Whereas, the transport 700 includes dual bearing rails 708 and 710 upon which the end effector 106 travels. Additionally, the transport 700 includes a cable and pulley drive mechanism 712 adapted to position and control motion of the end effector 106 along the bearing rails 708 and 710. Whereas the transport 1100 includes a sprocket and chain drive mechanism 1108 adapted to position and control motion of the end effector 126 along the bearing rail 1102. Transport mechanisms having the above described features are well known in the art, and further discussed in U.S. Pat. No. 6,217,272. As skilled artisans will appreciate any suitable transport mechanisms may be employed without deviating from the scope of the invention.

However, as discussed above with respect to FIGS. 1–4D, a transport mechanism, according to the illustrative embodiment of the invention, includes enhanced features adapted to further reduce accumulated positional errors in the substrate processing machine 100. More particularly, according to the illustrative embodiment both of the transports 700 and 1100 include enhanced end effector features.

By way of the example, the illustrative end effectors 106 and 226 include a locating feature, such as the substantially identical locating features 108 and 124. As shown in FIG. 7A, the locating feature 108 extends outward from the end effector 106 normal to a side surface 106a and is positioned substantially centrally longitudinally along the side surface 106a of the end effector 108. Similarly, as shown in FIG. 11, the locating feature 124 extends outward from the end effector 126 normal to a side surface 126a and is positioned substantially centrally longitudinally along the side surface 126a of the end effector 126.

As described above with respect to FIGS. 3A–3D and 4A–4D, the locating feature 108 is shaped and located to interfit and engage with the transport locating feature 216a of the pallet 114. Similarly, the locating feature 124 is particularly shaped and located to interfit and engage with the transport locating feature 216b of the pallet 114. According to the illustrative embodiment, the transport locating features 216a and 216b are substantially identical. Thus, the end effector locating features 108 are particularly adapted in the same fashion. By way of example, and as shown in detail in FIG. 7B, both end effector locating features 108 and 124 have elongated cylindrical shapes. Additionally, to facilitate interfitting and engagement with the transport locating features 216a and 216b, both illustrative end effector locating features 108 and 124 have tapered ends, such as shown at 108a in FIG. 7B. Notwithstanding the above, in some alternative embodiments, only one of the end effectors 106 and 226 include a locating feature. By way of example, in one alternative embodiment, only the end effector 106 includes a locating feature. In another alternative embodiment, only the end effector 226 includes a locating feature.

In the illustrative embodiment, both end effectors 106 and 126 also include enhanced support features, such as the support features 110a and 110b of the end effector 106 and the support features 123a and 123b of the end effector 126. As shown in FIG. 7A, the support feature 110a extends outward from the end effector 106 normal to the side surface 106a and is positioned proximate to a first distal end 702 of the end effector 106. Similarly, the support feature 110b extends outward from the end effector 106 normal to the side surface 106a and is positioned proximate to a second distal end 204 of the end effector 106. In like fashion, and as shown in FIG. 11, the support feature 123a extends outward from the end effector 126 normal to the side surface 126a and is positioned proximate to a first distal end 1110 of the end effector 126. Similarly, the support feature 123b extends outward from the end effector 126 normal to the side surface 126a and is positioned proximate to a second distal end 1112 of the end effector 126.

As described above with respect to FIGS. 1–4D, the support features 214a and 214b are particularly shaped to interfit and engage slidingly with the end effector support features 110a and 110b, respectively, of the end effector 106. The support features 214c and 214d are particularly shaped to interfit and engage slidingly with the end effector support features 123a and 123b of the end effector 126. According to the illustrative embodiment, the support features 110a, 110b, 123a and 123b are substantially identical. Accordingly, and as depicted in FIG. 4C, the support features 214a–214d of the pallet 114 are also substantially identical. Thus, the particular configuration of the support features 110a, 110b, 123a and 123b will be discussed with regard to the exemplary end effector detail of FIG. 7C.

Figure 7C:
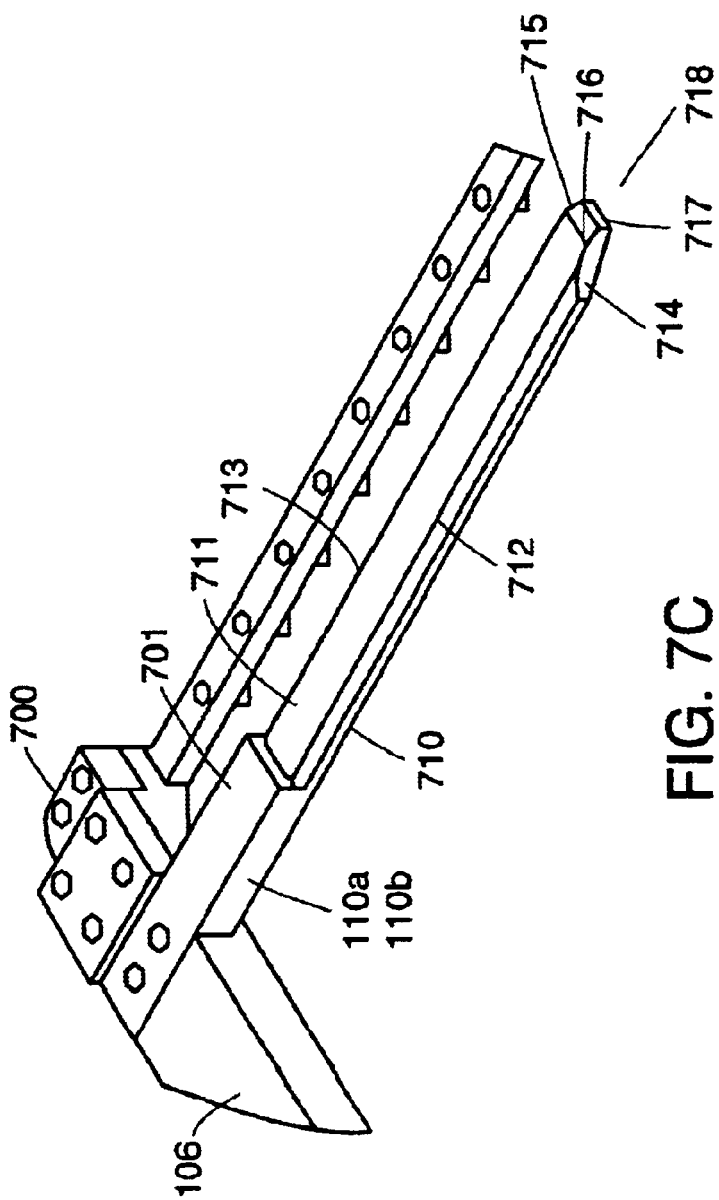
FIG. 7C is a detail, perspective view of an end effector support feature according to an illustrative embodiment of the invention.
Figure 8:
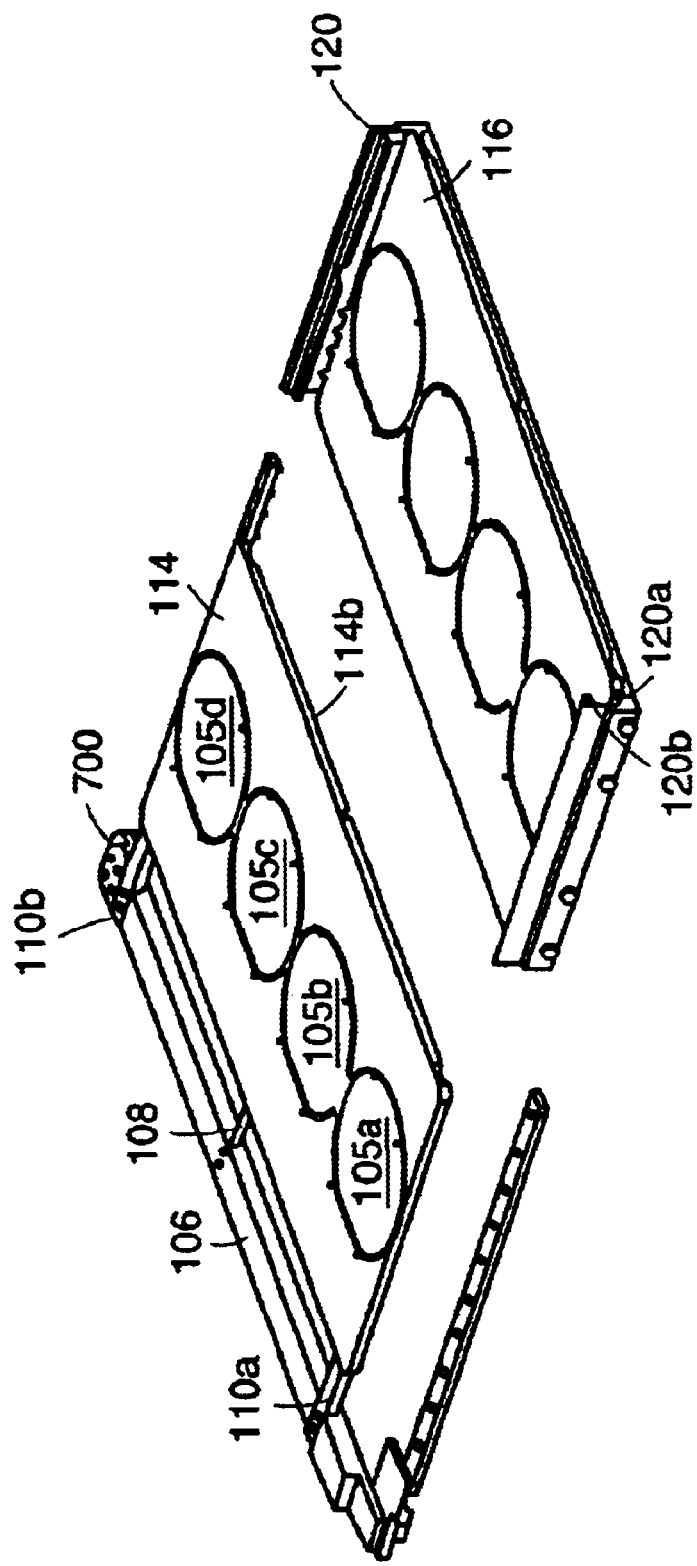
FIG. 8 is a perspective view of an illustrative substrate transport pallet being loaded onto a multistage elevator platform according to an illustrative embodiment of the invention.

As shown in FIG. 7C, the illustrative end effector support feature 110a/110b has a first section 701 having a substantially rectangular cross section. The end effector support feature 110a/110b also has a second section 710. The second section 710 has a reduced cross sectional dimension to create a substantially flat surface 711. The surface 711 has chamfered longitudinal edges 712 and 713. The support feature 110a/110b also includes an end section 718. The end section 718 has tapered side surfaces 714 and 715 and a tapered top surface 716 all acting to create a narrowing of the support feature 110a/110b in the end section 718. The support feature 110a/110b is so shaped to interfit and engage with the elongated, notched apertures of the support features 214a–214d, shown in detail in FIG. 4C, to support the pallet 114.

As described briefly with respect to FIGS. 1–2B, the end effector 106 transfers substrate processing pallets, such as the pallet 114, between the load lock 101 and a multistage elevator platform 120 located within the first process chamber 101. Similarly, the end effector 126 transfers substrate processing pallets, such as the pallet 114, between the multistage elevator platform 120 and the second process chamber 125.

FIGS. 8–10B depict various features of the elevator platform 120 and the substrate pallet 114 according to illustrative embodiments of the invention. Referring to FIGS. 8–10B, the elevator platform 120 has two, vertically aligned levels 120a and 120b adapted to receive substrate processing pallets, such as the pallet 114. Two horizontally aligned, parallel tracks 908a and 908b define a lower level 120a of the platform 120, while two other horizontally aligned, parallel tracks 906a and 906b define an upper level 120b. According to the illustrative embodiment of the invention, the tracks 906a, 906b, 908a and 908b are substantially identical.

As depicted, the lower level 120a includes a process chamber alignment feature 904a located along the track 908a, and a process chamber alignment feature 904b located along the track 908b. Similarly, the upper level 120b includes a process chamber alignment feature 902a located along the track 906a, and a process chamber alignment feature 902b located along the track 906b. According to the illustrative embodiment of the invention, the alignment features 902a, 902b, 904a and 904b are also substantially identically shaped. As shown in FIG. 9B, the alignment features, such as the features 902b and 904b, have a substantially cylindrical outer surface and are mounted on and substantially normal to a side surface 916 of the platform 120. The remaining alignment features 902a and 904a are mounted in a similar fashion with respect to the side surface 916 of the platform 120.

As shown in the detail 901 of FIG. 9B, each track, such as the track 906b includes a gap, such as the gap 912, located and sized to facilitate ease of installation of process chamber features, such as the feature 902b. However, in other embodiments, the such gaps need not be employed. Additionally, to facilitate engagement with a corresponding one of the process positioning features 218a and 218b located on the pallet 114, each of the process chamber features, such as the features 902b and 904b, are positioned vertically raised with respect the plane of its corresponding track.

With reference to FIGS. 1, 2A, 7A and 11, in one illustrative operation, a pallet transport, such as the pallet transports 700 and 1100, can extend an end effector, such as the end effectors 106 and 126, to provide a substrate processing pallet, such as the pallet 114, into a stage of the elevator platform 120, such as the upper stage 120b. Subsequent to the end effector 106/126 aligning the pallet 114 above the corresponding stage tracks, such as the tracks 906a and 906b, the multistage elevator 113 raises the elevator platform 120 to bring the tracks, such as the tracks 906a and 906b, into supporting contact with the bottom surface 222 of the pallet 114. Raising the platform 120 also causes process chamber alignment features, such as the features 902a and 902b, to interfit and engage with the process alignment features 218a and 218b of the pallet 114. As discussed above with respect to FIGS. 1–4B, as the fixed positioned chamber alignment features 902a and 902b interfit and engage with the process alignment features 218a and 218b, the pallet 214, if not already in an aligned positioned, shifts into such a position. Once the tracks 906a and 906b assume support of the pallet 114, the transport 700, 1100 retracts to remove the end effector 106, 126 from the first process chamber 103.

According to a further embodiment, a transport, such as the transports 700 and 1100, can extend into the first process chamber 103 to remove a pallet of substrates, such as the pallet 114, from the elevator platform 120, either pre- or post-processing. By way of example, in one embodiment, the elevator 113 aligns the upper level 120b of the platform 120 with the end effector 126. The transport 1100 then extends the end effector 126 through the flapper valve 134 to engage the pallet 114 with the support features 123a and 123b and the alignment feature 124. As discussed above with respect to FIGS. 1–4B, the support features 123a and 123b support the pallet 114 during transport and if the pallet 114 has become missaligned, interoperation between the end effector alignment feature 124 and the transport alignment feature 216b acts to reposition the pallet 114; thus, reducing accumulation of positional errors. Once the end effector 126 is positioned to support the pallet 114, the elevator 113 raises the platform 120 to disengage the chamber features 902a and 902b from the process alignment features 218a and 218b, respectively. Subsequent to disengagement, the transport 1100 retracts the end effector 126 and thus, the pallet 114 through the flapper valve 134 and into the second process chamber 125.

In operation, the illustrative substrate processing machine 100 is adapted to concurrently transport a batch of substrates contained on a pallet while processing another batch of substrates contained on another pallet. According to the illustrative embodiment, in operation, the substrate processing machine 100 performs repetitive cycles of such concurrent processing. An illustrative process cycle including such concurrent processing and/or transport will now be described in which the substrate processing machine begins in an initial state with all of the pallets 114, 116 and 118 not being loaded with substrates and ends with the substrates initially loaded onto the pallet 114 being removed from the load lock 101 subsequent to processing.

Referring to FIG. 2A, the substrate processing pallets 114, 116 and 118 begin in an initial state in which the pallets do not contain any substrates, such as the substrate 104, and in which the pallet 114 is supported by the end effector 106 in the load lock, the pallet 116 is located in the upper stage 120b of the elevator platform 120 of the first processing chamber 103 and the pallet 116 is supported by the end effector 126 in side of the second process chamber 125. Referring also to FIG. 6, the pin elevator raises the pin platform 115 to extend the lift pins, such as the lift pins 112a–112d through the lift pin apertures, such as the lift pin apertures 208a–208d. The robot arm 102 transfers substrates, such as the substrates 104, onto the lift pins of each recess 105a–105c. The pin elevator 111 then lowers the pin plate 115 to retract the lift pins through the lift pin apertures and thus, lowers the substrates into the recesses 105a–105c.

Referring also to FIGS. 2A, 3A, 4A, 9A and 11 either prior to, subsequent to or concurrent with the substrate loading, the multistage elevator 113 aligns the lower stage 120a of the elevator platform 120 with the end effector 126. The transport 1100 then extends the end effector 126 to place the pallet 118 in vertical alignment with the lower stage 120a of the platform 120. Subsequent to such alignment, the elevator 113 raises the platform 120 to bring the tracks 908a and 908b in supporting contact with underside 222 of the pallet 118, and to interfit and engage the process chamber alignment features 904a and 904b with the process alignment features 218a and 218b of the pallet 218. Subsequent to the tracks 908a and 908b being brought into contact with the underside 222 of the pallet 118, the transport 1100 retracts the end effector 126 through the flapper valve 134 and back into the second process chamber 125.

Next, the transport 1100 extends into the first process chamber 103 to remove the pallet 116 from the upper stage 120b of the elevator platform 120. According to the illustrative embodiment, the elevator 113 aligns the upper level 120b of the platform 120 with the end effector 126. The transport 1100 then extends the end effector 126 through the flapper valve 134 to engage the pallet 116 with the support features 123a and 123b and the alignment feature 124. Once the end effector 126 is positioned to support the pallet 116, the elevator 113 raises the platform 120 to disengage the chamber features 902a and 902b from the process alignment features 218a and 218b. Subsequent to disengagement, the transport 1100 retracts the end effector 126 and thus, the pallet 116 through the flapper valve 134 and into the second process chamber 125.

Next, according to the illustrative embodiment, the pallet transport 700 extends the end effector 106 to transport the pallet 114 into the upper stage 120b of the elevator platform 120. Subsequent to the end effector 106 vertically aligning the pallet 114 above the stage tracks 906a and 906b, the multistage elevator 113 raises the elevator platform 120 to bring the tracks 906a and 906b into supporting contact with the bottom surface 222 of the pallet 114. Raising the platform 120 also causes process chamber alignment features 902a and 902b to interfit and engage with the process alignment features 218a and 218b of the pallet 114. Once the tracks 906a and 906b assume the support of the pallet 114, the transport 700 retracts to remove the end effector 106 from the first process chamber 103.

Next, the transport 700 extends into the first process chamber 103 to remove the pallet 118 from the lower stage 120a of the elevator platform 120. According to the illustrative embodiment, the elevator 113 aligns the lower level 120a of the platform 120 with the end effector 106. The transport 700 then extends the end effector 106 into the first process chamber 103 to engage the pallet 118 with the support features 110a and 110b and the alignment feature 108. Once the end effector 106 is positioned to support the pallet 118, the elevator 113 raises the platform 120 to disengage the chamber features 904a and 904b from the process alignment features 218a and 218b. Subsequent to disengagement, the transport 700 retracts the end effector 106 and thus, the pallet 118 into the load lock 101.

With the pallet 114 now being the sole pallet inside of the first process chamber 102, the substrate processing machine 100 cleans the batch of substrates contained on the pallet 114, through, for example, a sputter clean process or other known method. Concurrently with cleaning the substrates contained on the pallet 114, the robot arm 102 loads substrates onto the pallet 118 contained in the load lock according to the same process described above with respect to loading substrates onto the pallet 114. Upon completion of the cleaning batch of substrates contained on the pallet 114, the transport 1100 transports the pallet 116 from the second process chamber 125 into the lower stage 120a of the platform 120 according to the same method described above for the transfer of the pallet 118 from the second chamber 125 to the first chamber 103. Next, the transport 1100 transports the pallet 114, according to the same process described above with respect to the transport of the pallet 116, from the upper stage 120b of the platform 120 into the second process chamber 125. The substrate processing machine 100 then begins deposition processing the batch of substrates contained on the pallet 114 in the second process chamber 125.

Concurrently with the deposition processing of the substrate batch contained on the pallet 114, the transport 700 transports the pallet 118 from the load lock 101 to the upper stage 120b of the platform 120 according to the same method described above for the transfer of the pallet 114 from the load lock 101 into the first process chamber 103. Next, the transport 700 transports the pallet 116 from the lower stage 120a of the platform 120 into the load lock 101 according to the same method described above with respect to transferring the pallet 116 from the first process chamber 101.

Next, concurrently with the deposition processing of the substrate batch contained on the pallet 114, the substrate processing machine 100 also performs cleaning processing on the substrates contained on the pallet 118 in the first process chamber 101. Additionally, the robot arm 102 load substrates into each of the recesses of the pallet 116.

Upon completion of the deposition processing in the second process chamber 125 and cleaning processing in the chamber 103, the transport 1100 transports the pallet 114 into the lower stage 120a of the platform 120, according to the same method employed to transfer the pallet 118 from the second process chamber 125 to the first process chamber 103. Next, the transport 1100 transports the pallet 118 from the upper stage 120b of the platform 120 into the second process chamber 125 according to the same method described above with respect to transporting the pallet 116 from the first process chamber 103 into the second process chamber 125.

Concurrently with the substrate processing machine 100 performing deposition processing in the second process chamber 125 on the substrate batch contained on the pallet 118, the transport 700 transports the pallet 116 from the load lock 101 to the upper stage 120b of the platform 120 according to the same method described above with respect to transporting the pallet 114 from the load lock 101 into the first process chamber 103. Next, the transport 700 transports the pallet 114 from the lower stage 120a of the platform 120 into the load lock 101 according to the same method as described above for transporting the pallet 116 from the first process chamber 103 into the load lock 101.

Concurrently, with the substrate processing machine 100 deposition processing the substrate batch contained on the pallet 118 in the second process chamber 125 and cleaning the substrate batch contained on the pallet 116 in the first process chamber 103, the robot arm 102 removes the batch of processed substrates from the pallet 114 to a storage device (not shown) and reloads another batch of substrates onto the pallet 114; thus, beginning the next processing cycle.

As skilled artisans will appreciate, the above described operational cycle can be repeated any desired number of times. In this way the illustrative features of the substrate processing pallets 114, 116 and 118 interoperate with the illustrative substrate processing machine 100 to enable the illustrative machine 100 to transport, clean and deposition process multiple batches of substrate concurrently. The features of the illustrative processing pallets 114, 116 and 118 further interoperate with the features of the illustrative processing machine to reduce processing errors due to the accumulation of both translational and rotational substrate and/or pallet positioning errors, due for example to mechanical vibrations, substrate and pallet transport, and thermal expansion factors.

As skilled artisans will appreciate, the system and methods of the above described invention may be embodied in other specific forms without departing from the spirit or essential characteristics thereof. The above described embodiments are therefore to be considered in all respects as illustrative and not restrictive in nature, the scope of the invention being indicated by the appended claims, rather than by the foregoing illustrative description, and all changes which come within the meaning and range of equivalency of the claims are therefore intended to be embraced therein.

What is claimed is:

1. A method of processing substrates comprising, providing a first batch of substrates onto a first substrate processing pallet, engaging a first transport positioning feature of said first substrate pallet with a first transport alignment feature of a first transport mechanism to particularly position said first substrate processing pallet with respect to said first transport mechanism, transporting, with said first transport mechanism, said first batch of substrates on said first substrate processing pallet to a first process chamber adapted to perform a first processing operation, engaging a first processes alignment feature of said first substrate processing pallet with a first chamber alignment feature located within said first chamber to particularly position said first substrate processing pallet with respect to said first process chamber, and performing said first processing operation on said first batch of substrates in said first process chamber.

2. The method of claim 1 further comprising, transporting, with a second transport mechanism, said first batch of substrates on said first substrate processing pallet to a second process chamber adapted to perform a second processing operation, and performing said second processing operation on said first batch of substrates in said second process chamber.

3. The method of claim 2 further comprising, prior to said transporting step, engaging a second transport positioning feature of said first substrate pallet with a second transport alignment feature of said second transport mechanism to particularly position said first substrate processing pallet with respect to said second transport mechanism.

4. The method of claim 2 further comprising, providing a second batch of substrates onto a second substrate pallet substantially concurrently with said step of transporting said first batch of substrates with said second transport mechanism.

5. The method of claim 2 further comprising, providing a second batch of substrates onto a second substrate pallet substantially concurrently with said step of performing said second processing operation on said first batch of substrates.

6. The method of claim 2 further comprising, providing a second batch of substrates onto a second substrate pallet, transporting said second substrate pallet into said first process chamber, and performing first processing operation on said second batch of substrates substantially concurrently with said step of performing said second processing operation on said first batch of substrates.

7. The method of claim 2 further comprising, providing a second batch of substrates onto a second substrate processing pallet, engaging a first transport positioning feature of said second substrate pallet with said first transport alignment feature of said first transport mechanism to particularly position said second substrate processing pallet with respect to said first transport mechanism, transporting, with said first transport mechanism, said second batch of substrates on said second substrate processing pallet to said first process chamber, engaging a first processes alignment feature of said second substrate processing pallet with said first chamber alignment feature located within said first chamber to particularly position said second substrate processing pallet with respect to said first process chamber, and performing said first processing operation on said second batch of substrates substantially concurrently with said step of performing said second processing operation on said first batch of substrates.

8. The method of claim 1 further comprising, providing a second batch of substrates onto a second substrate pallet substantially concurrently with said step of performing said first processing operation on said first batch of substrates.

9. The method of claim 1 further comprising, transporting, with a second transport mechanism, said first batch of substrates on said first substrate processing pallet to a second process chamber adapted to perform a second processing operation, providing a second batch of substrates onto a second substrate pallet, engaging a first transport positioning feature of said second substrate pallet with said first transport alignment feature of said first transport mechanism to particularly position said second substrate processing pallet with respect to said first transport mechanism, transporting, with said first transport mechanism, said second batch of substrates on said second substrate processing pallet to said first process chamber, engaging a first processes alignment feature of said second substrate processing pallet with said first process chamber alignment feature located within said first process chamber to particularly position said second substrate processing pallet with respect to said first process chamber, and providing a third batch of substrates onto a third substrate processing pallet.

10. The method of claim 9 further comprising, performing said step of providing said third batch of substrates onto said third pallet substantially concurrently with performing said step of transporting said first batch of substrates to said first process chamber.

11. The method of claim 9 further comprising, performing said step of providing said third batch of substrates onto said third pallet substantially concurrently with performing said second processing operation on said first batch of substrates.

12. The method of claim 9 further comprising, performing said step of providing said third batch of substrates onto said third pallet substantially concurrently with performing said first processing operation on said second batch of substrates.

13. The method of claim 1, wherein said step of providing said first batch of substrates further comprises, extending lift pins through lift pin apertures in said first substrate processing pallet, placing said first batch of substrates onto said lift pins, and retracting said lift pins to lower said first batch of substrates onto said first substrate processing pallet.

14. The method of claim 1 further comprising, subsequent to said step of performing said first processing operation, extending lift pins through lift pin apertures in said first substrate processing pallet, to raise said first batch of substrates above said first substrate processing pallet to facilitate removal of said first batch substrates from said first substrate processing pallet.

15. The method of claim 1, wherein said step of providing a first batch of substrates further comprises, providing each of said first batch of substrates into an associated recess in said first substrate processing pallet, each said associated recess being adapted to receive one of said first batch of substrates.

16. The method of claim 2 further comprising, providing a load lock adapted for containing said first transport mechanism and said first substrate processing pallet during said step of providing said first batch of substrates to said first substrate processing pallet, and subsequent to completion of said step of performing said second processing operation, returning said first batch of substrates on said first substrate pallet through said first process chamber to said load lock.

17. The method of 16 further comprising, subsequent to said step of returning said first batch of substrates to said load lock, automatedly removing said first batch of substrates from said first substrate processing pallet.

* * * * *